(12) United States Patent
Lee et al.

(10) Patent No.: US 9,679,815 B2
(45) Date of Patent: Jun. 13, 2017

(54) SEMICONDUCTOR DEVICE AND METHOD OF FABRICATING THE SAME

(71) Applicants: Dong Hun Lee, Anyang-Si (KR); Sunhom Steve Paak, Seoul (KR)

(72) Inventors: Dong Hun Lee, Anyang-Si (KR); Sunhom Steve Paak, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/050,505

(22) Filed: Feb. 23, 2016

(65) Prior Publication Data
US 2016/0307802 A1  Oct. 20, 2016

(30) Foreign Application Priority Data
Apr. 15, 2015  (KR) .......................... 10-2015-0053027

(51) Int. Cl.
*H01L 21/30* (2006.01)
*H01L 21/8234* (2006.01)
*H01L 21/308* (2006.01)
*H01L 27/11* (2006.01)

(52) U.S. Cl.
CPC .. *H01L 21/823431* (2013.01); *H01L 21/3086* (2013.01); *H01L 27/1104* (2013.01)

(58) Field of Classification Search
CPC .. H01L 21/8234; H01L 21/033; H01L 27/105
USPC ................................................. 438/424, 585
See application file for complete search history.

(56) References Cited

U.S. PATENT DOCUMENTS

| 7,709,396 | B2 | 5/2010 | Bencher et al. |
| 7,763,531 | B2 | 7/2010 | Abadeer et al. |
| 8,524,605 | B1* | 9/2013 | Chen ...................... H01L 29/00 257/E21.249 |
| 8,557,675 | B2 | 10/2013 | LiCausi |
| 8,653,630 | B2 | 2/2014 | Liaw et al. |
| 8,669,167 | B1 | 3/2014 | Chang et al. |

(Continued)

*Primary Examiner* — Julia Slutsker
*Assistant Examiner* — Dmitriy Yemelyanov
(74) *Attorney, Agent, or Firm* — Myers Bigel, P.A.

(57) ABSTRACT

A semiconductor device fabrication method includes sequentially forming a hard mask layer and a sacrificial layer on a substrate, forming an upper mandrel which includes first to third upper sub-mandrels on the sacrificial layer, the first to third upper sub-mandrels extending in a first direction and being spaced apart from each other in a second direction, a width of the first upper sub-mandrel being smaller than widths of the second and third upper sub-mandrels, forming first spacers on sidewalls of each of the upper sub-mandrels, removing the upper mandrel, etching the sacrificial layer using the first spacers as etching masks to form a lower mandrel that includes a plurality of sub-mandrels, forming second spacers on sidewalls of the lower sub-mandrels, removing the lower mandrel, patterning the hard mask layer and the substrate using the second spacers as etching masks to form first to tenth fins which extend alongside each other in the first direction and are spaced apart from each other in the second direction, removing the first, second, fifth and eighth fins, and forming a first gate electrode that intersects the third, fourth, sixth and seventh fins, and a second gate electrode that intersects the sixth, seventh, ninth and tenth fins while not intersecting the third and fourth fins.

21 Claims, 26 Drawing Sheets

(56) References Cited

U.S. PATENT DOCUMENTS

| | | |
|---|---|---|
| 8,716,080 B2 | 5/2014 | Fumitake |
| 8,809,169 B2 | 8/2014 | O'Meara et al. |
| 8,860,184 B2 | 10/2014 | Sivakumar et al. |
| 8,906,757 B2 | 12/2014 | Kim et al. |
| 8,921,225 B2 | 12/2014 | Yuan et al. |
| 8,975,129 B1 * | 3/2015 | Shieh .................. H01L 21/3086 438/199 |
| 2007/0292996 A1 * | 12/2007 | Abadeer ................ B07C 5/344 438/165 |
| 2014/0131813 A1 * | 5/2014 | Liaw .................. H01L 27/1104 257/401 |

* cited by examiner

1200

1300

1400

SEMICONDUCTOR DEVICE AND METHOD OF FABRICATING THE SAME

CROSS-REFERENCE TO RELATED APPLICATION

This application claims priority under 35 U.S.C. §119 from Korean Patent Application No. 10-2015-0053027, filed on Apr. 15, 2015 in the Korean Intellectual Property Office, the entire contents of which are incorporated herein by reference.

BACKGROUND

1. Field of the Invention

The inventive concepts relate to a semiconductor device and a method of fabricating the same.

2. Description of the Related Art

Multi-gate transistors that have a multichannel active pattern having a fin or nanowire shape are used to enhance the integration density of semiconductor devices. Since the multi-gate transistor uses a three-dimensional channel, it may be easily scaled. Further, it is possible to improve the current control capability without increasing a gate length of the multi-gate transistor. Furthermore, it is possible to effectively suppress a short channel effect in which potential of a channel region is influenced by the drain voltage.

SUMMARY

An aspect of the inventive concepts provides a semiconductor device with improved operational characteristics.

Another aspect of the inventive concepts provides a method of fabricating a semiconductor device with improved operational characteristics.

The aspects of the present disclosure are not limited to the above-mentioned aspects, and other aspects that have not been mentioned will be clearly understood to those skilled in the art from the following description.

According to an aspect of the inventive concepts, there is provided a method of fabricating a semiconductor device, the method comprising sequentially forming a hard mask layer and a first sacrificial layer on a substrate, forming an upper mandrel that includes at least first to third upper sub-mandrels on the first sacrificial layer, the first to third upper sub-mandrels each extending in a first direction and being spaced apart from each other in a second direction that intersects the first direction, a width of the upper sub-mandrel in the second direction being smaller than widths of the second and third upper sub-mandrels in the second direction, forming first spacers on both side walls of each of the first through third upper sub-mandrels, removing the upper mandrel, etching the first sacrificial layer using the first spacers as etching masks to form a lower mandrel that includes at least first through third lower sub-mandrels, forming second spacers on both side walls of the first through third lower sub-mandrels, removing the lower mandrel, patterning the hard mask layer and the substrate using the second spacers as etching masks to form a fin type pattern, the fin type pattern including first to tenth fins which extend alongside each other in the first direction and are spaced apart from each other in the second direction, removing the first, second, fifth and eighth fins and forming a first gate electrode and a second gate electrode, the first gate electrode extending in the second direction to intersect the third, fourth, sixth and seventh fins, and the second gate electrode extending in the second direction to intersect the sixth, seventh, ninth and tenth fins while not intersecting the third and fourth fins, and being spaced apart from the first gate electrode in the first direction.

In some embodiments of the inventive concepts, forming the upper mandrel comprises forming a second sacrificial layer on the first sacrificial layer and forming the upper mandrel by etching the second sacrificial layer.

In some embodiments of the inventive concepts, the method may further comprise forming an anti-reflective layer between the first and second sacrificial layers.

In some embodiments of the inventive concepts, a width of the second upper sub-mandrel is different from a width of the third upper sub-mandrel.

In some embodiments of the inventive concepts, an interval between the first and second upper sub-mandrels is smaller than an interval between the second and third upper sub-mandrels.

In some embodiments of the inventive concepts, the first spacer is formed by an atomic layer deposition process.

In some embodiments of the inventive concepts, the lower sub-mandrels all have the same width in the second direction.

In some embodiments of the inventive concepts, the hard mask layer contains at least one of silicon-containing materials, a carbon-containing material, or a metal.

In some embodiments of the inventive concepts, the method may further comprise forming an element isolation film after removing the first, second, fifth and eighth fins, wherein the third, fourth, sixth, seventh, ninth and tenth fin type patterns protrude above an upper surface of the element isolation film.

In some embodiments of the inventive concepts, forming the element isolation film comprises forming a trench by etching the first and second fins and forming the element isolation film in the trench.

In some embodiments of the inventive concepts, removing the first, second, fifth and eighth fins comprises forming a first trench by etching the first and second fins, forming a second trench by etching the fifth fin, and forming a third trench by etching the eighth fin.

According to another aspect of the inventive concepts, there is provided a method of fabricating a semiconductor device, the method comprising sequentially forming a hard mask layer and a sacrificial layer on a substrate, forming a first dummy mandrel and a first active mandrel on the sacrificial layer, a width of the first dummy mandrel being different from a width of the first active mandrel, forming a second dummy mandrel spaced apart by the width of the first dummy mandrel, and a second active mandrel spaced apart by the width of the first active mandrel, forming a plurality of first dummy fins spaced apart from each other by the width of the second dummy mandrel, and an active fin and a second dummy fin spaced apart from each other by the second active mandrel, forming first to sixth active fins which extend alongside one another in a first direction and are sequentially spaced apart from one another in a second direction intersecting with the first direction, by etching the first and second dummy fins and forming a first gate electrode and a second gate electrode, the first gate electrode extending in the second direction and intersecting with the first to fourth active fins, and the second gate electrode extending in the second direction, intersecting with the third through sixth active fins, not intersecting with the first and second active fins, and being spaced apart from the first gate electrode in the first direction. In some embodiments of the present inventive concept, etching the first dummy fin comprises forming a trench while etching the first dummy fin.

In some embodiments of the present inventive concept, etching the first dummy fin comprises forming a trench while etching the first dummy fin.

In some embodiments of the present inventive concept, the method may further comprise forming an element isolation film that fills the trench.

In some embodiments of the present inventive concept, widths of the second dummy mandrel and the second active mandrel are identical to each other.

In some embodiments of the present inventive concept, the first and second active fins intersect with the first gate electrode to define a first transistor, the third active fin intersects with the first gate electrode to define a second transistor, and the fourth active fin intersects with the second gate electrode to define a third transistor.

In some embodiments of the present inventive concept, conductivity type of the first transistor is different from conductivity type of the second and third transistors.

In some embodiments of the present inventive concept, the conductivity type of the first transistor is an N type, and the conductivity type of the second and third transistors is a P type.

According to still another aspect of the inventive concepts, there is provided a method of fabricating a semiconductor device, the method comprising sequentially forming a hard mask layer and a first sacrificial layer on a substrate, forming an upper mandrel that includes a plurality of upper sub-mandrels on the first sacrificial layer, forming first spacers on side walls of the upper sub-mandrels, removing the upper mandrel, etching the first sacrificial layer using the first spacers as etching masks to form a lower mandrel that includes a plurality of lower sub-mandrels, forming second spacers on side walls of the lower sub-mandrels, removing the lower mandrel, forming first to sixth active fins which extend alongside one another in a first direction and are spaced apart from one another in a second direction that intersects the first direction by patterning the hard mask layer and the substrate using the second spacers as etching masks and forming a first gate electrode and a second gate electrode, the first gate electrode extending in the second direction to intersect the first to fourth active fins, and the second gate electrode extending in the second direction to intersect the third through sixth active fins, the second gate electrode not intersecting the first and second active fins, and being spaced apart from the first gate electrode in the first direction.

In some embodiments of the inventive concepts, the plurality of upper sub-mandrels includes at least a first upper sub-mandrel and a second upper sub-mandrel, and widths of the first and second upper sub-mandrels are different from each other.

In some embodiments of the inventive concepts, an interval between the first and second active fins is less than 40 nm.

In some embodiments of the inventive concepts, a part of the third active fin overlaps a part of the fourth active fin in the second direction.

In some embodiments of the inventive concepts, the method may further comprise forming trenches on both sides of the first to sixth active fins and filling the trenches to form an element isolation film, wherein the first to sixth active fins protrude above an upper surface of the element isolation film.

According to an aspect of the inventive concepts, there is provided a semiconductor device comprising first to sixth active fins that extend alongside one another in a first direction, a first gate electrode that extends in a second direction that intersects the first direction, the first gate electrode intersecting the first to fourth active fins and a second gate electrode that extends in the second direction to intersect the third through sixth active fins, the second gate electrode not intersecting the first and second active fins, the second gate electrode spaced apart from the first gate electrode in the first direction, wherein a first interval between the first and second active fins is the same as a second interval between the fifth and sixth active fins, and wherein a third interval between the second and third active fins is different from the first interval and is not an integer multiple of the first interval.

In some embodiments of the inventive concepts, the semiconductor device may further comprise a first trench between the second and third active fins, and a second trench between the fourth and fifth active fins.

In some embodiments of the inventive concepts, side walls of the first trench are discontinuous with side walls of the second and third active fins.

In some embodiments of the inventive concepts, lengths of the first and second active fins are different from lengths of the third and fourth active fins.

In some embodiments of the inventive concepts, an interval between the first and second active fins is less than 40 nm.

In some embodiments of the inventive concepts, the first to sixth active fins are formed by a self-aligned quadruple patterning (SAQP) technique.

In some embodiments of the inventive concepts, the third interval is greater than the first interval.

In some embodiments of the inventive concepts, a part of the third active fin overlaps a part of the fourth active fin in the second direction.

In some embodiments of the inventive concepts, the first and second active fins intersect the first gate electrode to define a first transistor, the third active fin intersects the first gate electrode to define a second transistor, and the fourth active fin intersects the second gate electrode to define a third transistor.

In some embodiments of the inventive concepts, a conductivity type of the first transistor is different than a conductivity type of the second and third transistors.

In some embodiments of the inventive concepts, the conductivity type of the first transistor is N type conductivity, and the conductivity type of the second and third transistors is P type conductivity.

In some embodiments of the inventive concepts, the semiconductor device may further comprise an impurity-doped epitaxial layer on the first to sixth active fins, wherein the conductive type of portions of the impurity-doped epitaxial layer that are on the first and second active fins and the fifth and sixth active fins is different from the conductivity type of portions of the impurity-doped epitaxial layer that are on the third and fourth active fins.

In some embodiments of the inventive concepts, the semiconductor device may further comprise a memory cell array region and a peripheral region, wherein the memory cell array region includes a plurality of memory cell regions, and each of the memory cell regions includes the first to sixth active fins, and the first and second gate electrodes.

According to still another aspect of the inventive concepts, there is provided a method of fabricating a semiconductor device, the method comprising forming a hard mask layer on a substrate; forming a first sacrificial layer on the hard mask layer opposite the substrate; forming an upper mandrel that includes at least a first upper sub-mandrel and a second upper sub-mandrel on the first sacrificial layer, the first and second upper sub-mandrels each extending in a first direction and being spaced apart from each other in a second direction that intersects the first direction; forming first spacers on side walls of the first upper sub-mandrel and the second upper sub-mandrel; selectively removing the upper mandrel; etching the first sacrificial layer using the first spacers as etching masks to form a lower mandrel that includes at least first to fourth lower sub-mandrels; forming second spacers on side walls of the first through fourth lower sub-mandrels; removing the lower mandrel; patterning the hard mask layer and the substrate using the second spacers as etching masks to form a fin type pattern, the fin type pattern including first to eighth fins which extend alongside each other in the first direction and are spaced apart from each other in the second direction; removing the third and sixth fins; and forming a first gate electrode and a second gate electrode, the first gate electrode extending in the second direction to intersect the first, second, fourth and fifth fins, and the second gate electrode extending in the second direction to intersect the fourth, fifth, seventh and eighth fins while not intersecting the first and second fins, and being spaced apart from the first gate electrode in the first direction.

In some embodiments of the inventive concepts, a first interval between the first and second fins may be the same as a second interval between the seventh and eighth fins, and a third interval between the second and fourth fins is different from the first interval and may not be an integer multiple of the first interval.

In some embodiments of the inventive concepts, an interval between the first and second fins may be less than 40 nm.

In some embodiments of the inventive concepts, the first and second fins may intersect the first gate electrode to define a first transistor, the fourth fin may intersect the first gate electrode to define a second transistor, and wherein the fifth fin may intersect the second gate electrode to define a third transistor.

In some embodiments of the inventive concepts, the conductivity type of the first transistor may be different than the conductivity types of the second and third transistors.

BRIEF DESCRIPTION OF THE DRAWINGS

The above and other aspects and features of the inventive concepts will become more apparent by describing in detail exemplary embodiments thereof with reference to the attached drawings, in which.

DETAILED DESCRIPTION OF THE EMBODIMENTS

The inventive concepts will now be described more fully hereinafter with reference to the accompanying drawings, in which embodiments thereof are shown. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions may be exaggerated for clarity.

It will be understood that when an element or layer is referred to as being "connected to," or "coupled to" or "on" another element or layer, it can be directly connected to or coupled to or on another element or layer or intervening elements or layers may be present. In contrast, when an element is referred to as being "directly connected to" or "directly coupled to" or "directly on" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concepts.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or exemplary terms provided herein is intended merely to better illuminate the inventive concepts and is not a limitation on the scope of the inventive concepts unless otherwise specified.

Figure 1:
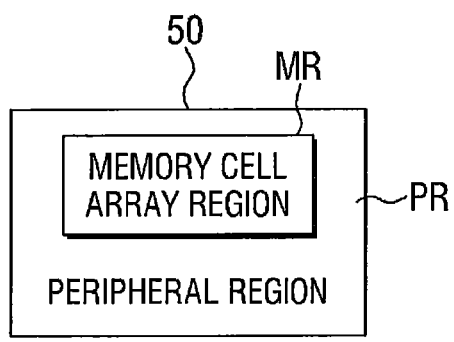
FIG. 1 is a conceptual diagram of a semiconductor device according to an embodiment of the inventive concepts.
Figure 2:
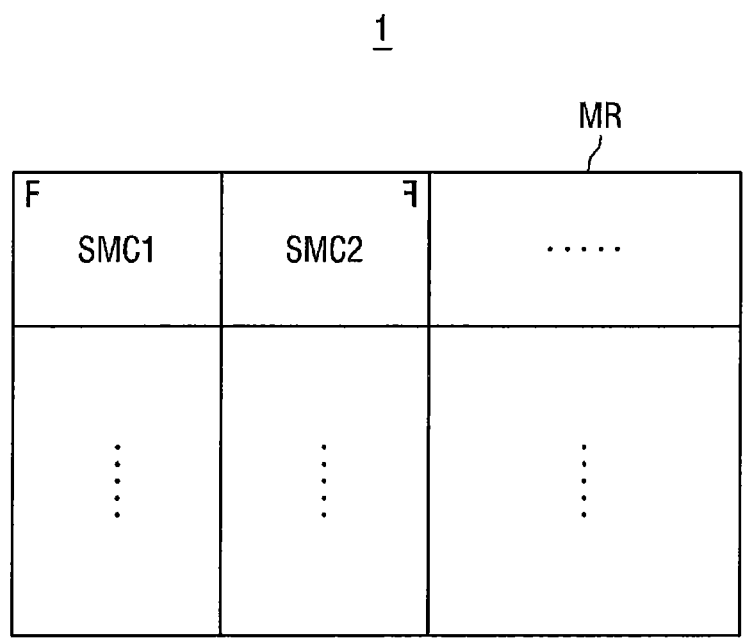
FIG. 2 is a conceptual diagram of a memory cell array region of FIG. 1.

FIG. 1 is a conceptual diagram of a semiconductor device 1 according to an embodiment of the inventive concepts. FIG. 2 is a conceptual diagram of a memory cell array region of FIG. 1.

Referring to FIG. 1, the semiconductor device 1 can include a memory cell array region MR and a peripheral circuit region PR. The memory cell array region MR and the peripheral circuit region PR can be disposed on a substrate 50 of the semiconductor device 1.

Memory elements can be disposed in the memory cell array region MR. As examples of the memory elements, it is possible to adopt a static random access memory (SRAM), a dynamic random access memory (DRAM), a NAND or NOR flash memory, a magnetic random access memory (MRAM), a phase change random memory (PRAM), a resistive random access memory (RRAM) and the like, but the inventive concepts are not limited thereto.

Elements used to drive the memory elements disposed in the memory cell array region MR can be disposed in the peripheral circuit region PR. Examples of such elements include an input and output buffer (I/O buffer), a read circuit, a write circuit or the like, but the inventive concepts are not limited to these examples.

Referring to FIG. 2, the memory cell array region MR can include a plurality of memory cell regions.

Hereinafter, a configuration will be described as an example in which the memory cell array region MR includes a plurality of SRAM memory cell regions SMC1, SMC2 that each include a plurality of SRAM elements disposed therein, but the inventive concepts are not limited thereto.

The plurality of SRAM memory cell regions SMC1, SMC2 can be disposed in a grid shape as illustrated to have an array form. SRAM cells can be disposed in each of the SRAM memory cell regions SMC1, SMC2.

The SRAM cell will be described in more detail below with reference to FIGS. 3 to 6.

Figure 3:
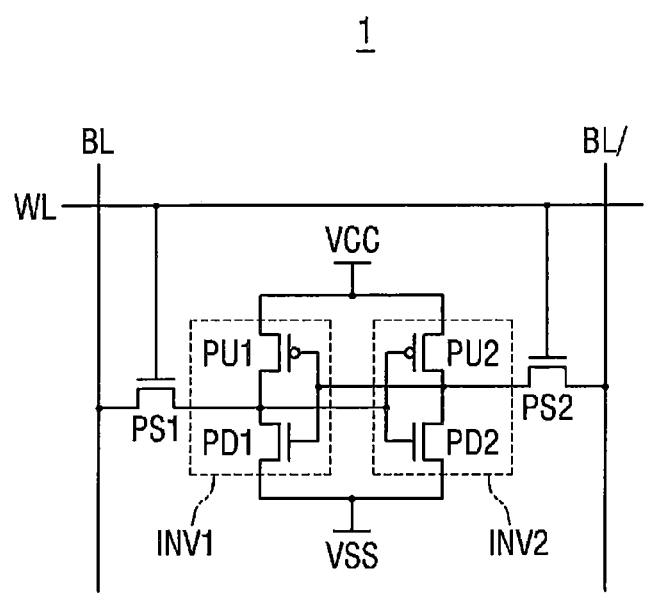
FIG. 3 is a circuit diagram of a SRAM memory cell region of FIG. 2.
Figure 4:
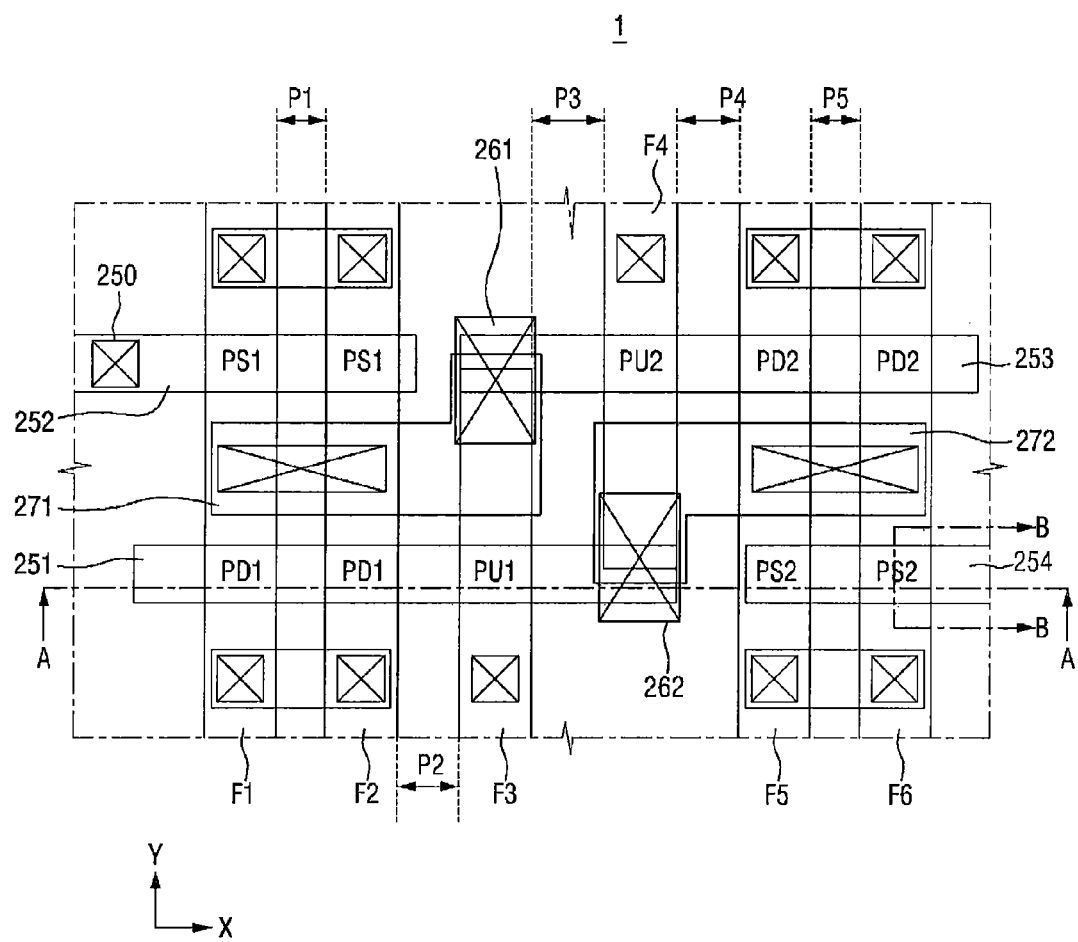
FIG. 4 is a layout diagram of the SRAM memory cell region of FIG. 2.
Figure 5:
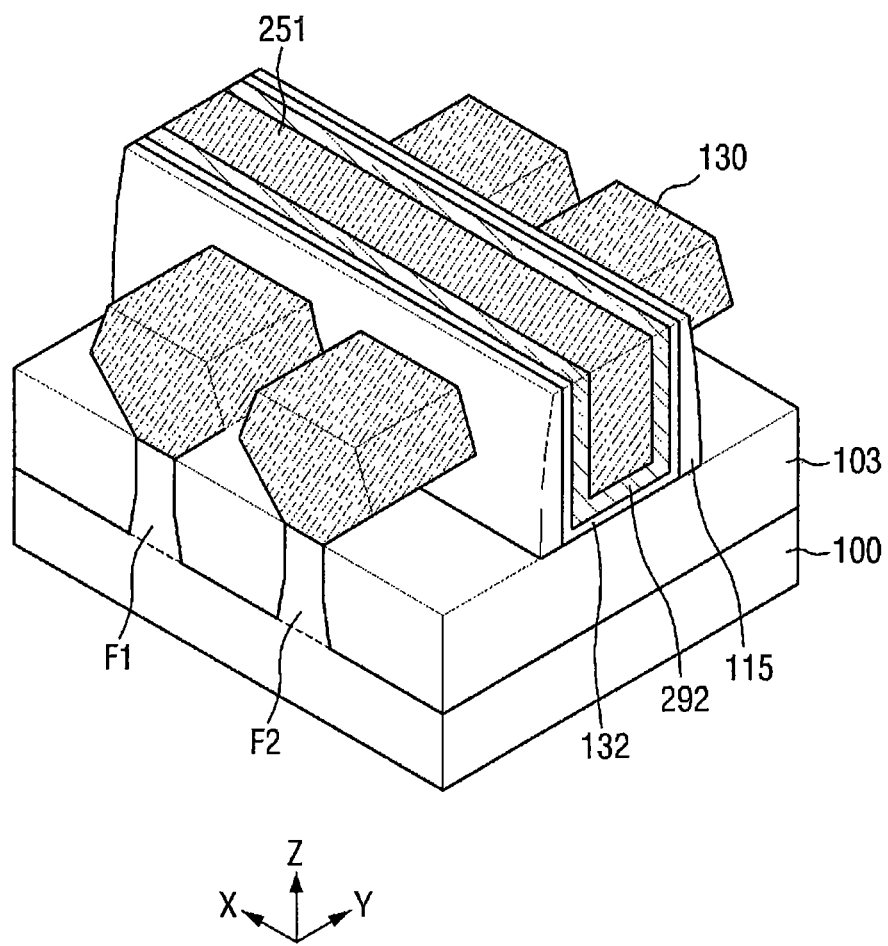
FIG. 5 is a perspective view illustrating a pull-down transistor of FIG. 4.
Figure 6:
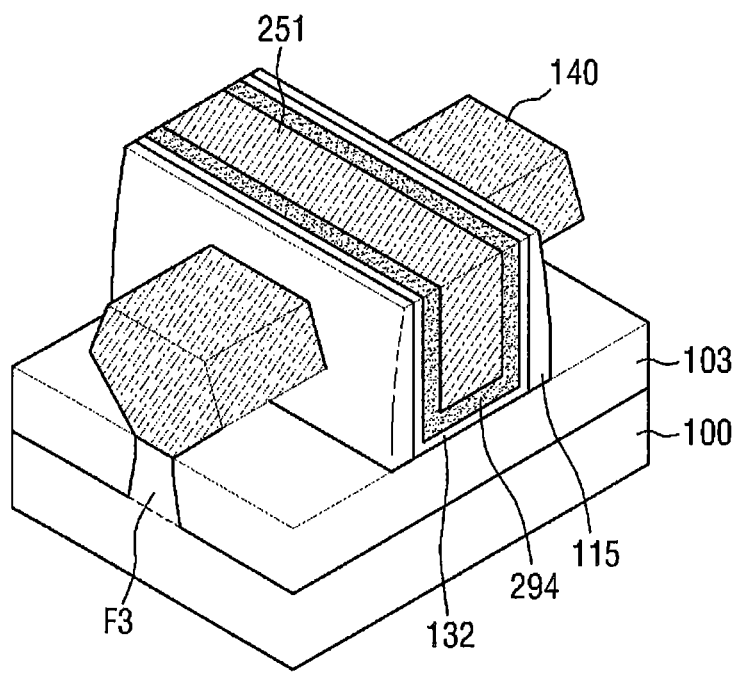
FIG. 6 is a perspective view illustrating a pull-up transistor of FIG. 4.

FIG. 3 is a circuit diagram of a SRAM memory cell region of FIG. 2. FIG. 4 is a layout diagram of the SRAM memory cell region of FIG. 2. FIG. 5 is a perspective view illustrating a pull-down transistor of FIG. 4. FIG. 6 is a perspective view illustrating a pull-up transistor of FIG. 4.

First, Referring to FIG. 3, the semiconductor device 1 can include a pair of inverters INV1, INV2 connected in parallel between a power supply node Vcc and a ground node Vss, and a first pass transistor PS1 and a second pass transistor PS2 that are connected to output nodes of the respective inverters INV2, INV1.

The first pass transistor PS1 and the second pass transistor PS2 can be connected to a bit line BL and a complementary bit line BL/, respectively. The gates of the first pass transistor PS1 and the second pass transistor PS2 can be connected to a word line WL.

The first inverter INV1 can include a first pull-up transistor PU1 and a first pull-down transistor PD1 that are connected in series between the power supply node Vcc and the ground node Vss, and the second inverter INV2 can include a second pull-up transistor PU2 and a second pull-down transistor PD2 that are connected in series between the power supply node Vcc and the ground node Vss.

In an embodiment, the first pull-up transistor PU1 and the second pull-up transistor PU2 can be PFET transistors, and the first pull-down transistor PD1 and the second pull-down transistor PD2 can be NFET transistors.

Further, in order for the first inverter INV1 and the second inverter INV2 to constitute a latch circuit, an input node of the first inverter INV1 can be connected to an output node of the second inverter INV2, and an input node of the second inverter INV2 can be connected to an output node of the first inverter INV1.

Referring to FIGS. 3 to 7, a first active fin F1, a second active fin F2, a third active fin F3, a fourth active fin F4, a fifth active fin F5 and a sixth active fin F6 are spaced apart from one another in a first direction X and each of these active fins F1-F6 extend in a second direction Y.

In some embodiments, as illustrated, the third active fin F3 and the fourth active fin F4 can be shorter than the remaining active fins F1, F2, F5, F6.

The first active fin F1 and the second active fin F2 can be spaced apart from each other by a first interval P1. The second active fin F2 and the third active fin F3 can be spaced apart from each other by a second interval P2. The third active fin F3 and the fourth active fin F4 can be spaced apart from each other by a third interval P3. The fourth active fin F4 and the fifth active fin F5 can be spaced apart from each other by a fourth interval P4. The fifth active fin F5 and the sixth active fin F6 can be spaced apart from each other by a fifth interval P5. The fifth interval P5 can be the same as the first interval P1 in some embodiments.

The second interval P2 can be greater than the first interval P1. Thus, the first and second active fins F1, F2 can be closer to each other than are the third and fourth active fins F3, F4, and the fifth and sixth active fins F5, F6 can be closer to each other than are the third and fourth active fins F3, F4.

Further, the third interval P3 can be greater than the first interval P1. The fourth interval P4 can also be greater than the first interval P1. The fourth interval P4 can be the same as the second interval P2 in some embodiments. However, the fourth interval P4 may be different from the second interval P2 in other embodiments.

The third interval P3 can be different from the second interval P2 and the fourth interval P4. However, embodiments of the inventive concepts are not limited thereto.

A first gate electrode 251, a second gate electrode 252, a third gate electrode 253 and a fourth gate electrode 254 can extend in the first direction X.

The first gate electrode 251 can be spaced apart from the fourth gate electrode 254 in the first direction X and can be spaced apart from the second and third gate electrodes 252, 253 in the second direction Y. The second gate electrode 252 can be spaced apart from the third gate electrode 253 in the first direction X, and can be spaced apart from the first and fourth gate electrodes 251, 254 in the second direction Y.

The first gate electrode 251 can intersect the first to fourth active fin F1, F2, F3, F4. The second gate electrode 252 can intersect the first and second active fins F1, F2. The third gate electrode 253 can intersect the third to sixth active fins F3, F4, F5, F6. The fourth gate electrode 254 can intersect the fifth and sixth active fins F5, F6.

Specifically, the first gate electrode 251 can completely intersect the first to third active fins F1, F2, F3 and can partially overlap a terminal end of the fourth active fin F4. The third gate electrode 253 can completely intersect the fourth to sixth active fins F4, F5, F6 and can partially overlap a terminal end of the third active fin F3.

Referring to FIGS. 4 and 5, the first pull-down transistor PD1 can be defined at an intersection region between the first gate electrode 251 and the first and second active fins F1, F2.

The first pull-down transistor PD1 can include the first and second active fins F1, F2, a first gate electrode 251, a first work function adjusting layer 292, a gate insulating film 132, a spacer 115 and a first impurity epitaxial layer 130.

The first and second active fins F1, F2 can protrude from the substrate 100 in a third direction Z and may extend in the second direction Y.

In some embodiments, the substrate 100 can include a semiconductor material. The semiconductor material can, for example, comprise one or more materials selected from a group consisting of Si, Ge, SiGe, GaP, GaAs, SiC, SiQeC, InAs and InP.

However, embodiments of the inventive concepts are not limited to these examples. For example, in some other embodiments, the substrate 100 may be an insulating substrate. That is, the substrate 100, for example, may be a silicon on insulator (SOI) substrate. Thus, if the substrate 100 is SOI, the response speed of the semiconductor device can be improved.

The first and second active fins F1, F2 can have a long side and a short side, respectively.

In FIG. 4, the long sides of the first and second active fins F1, F2 extend in the second direction Y, and the short sides of the first and second active fins F1, F2 extend in the first direction X, but the present disclosure is not limited thereto.

In some other embodiments, the long sides of the first and second active fins F1, F2 may extend in the first direction X, and the short sides of the first and second active fins F1, F2 may extend in the second direction Y.

The first and second active fins F1, F2 may be a part of the substrate 100 and/or may include an epitaxial layer that is grown from the substrate 100.

In some embodiments, the first and second active fins F1, F2 can include a semiconductor material. In this case, the first and second active fins F1, F2, for example, can contain Si, SiGe or the like.

In some embodiments, the first and second active fins F1, F2 can contain the same material as the substrate 100. For example, when the substrate 100 comprises Si, the first and second active fins F1, F2 can also comprise Si.

However, the present disclosure is not limited thereto, and the substrate 100 and the first and second active fins F1, F2 can also contain materials different from each other.

For example, when the substrate 100 contains Si, the first and second active fins F1, F2 can contain semiconductor materials different from Si. In this case, the first and second active fins F1, F2 can be formed on the substrate 100, for example, through an epitaxial growth process.

An element isolation film 103 can be formed on the substrate 100 to cover portions of the side walls of the first and second active fins F1, F2 and expose the upper portions of the first and second active fins F1, F2. That is, as illustrated, the element isolation film 103 can cover the lower portions of the first and second active fins F1, F2.

In some embodiments, the element isolation film 103 can, for example, include any one of an oxide film, an oxynitride film or a nitride film, but embodiments of the inventive concepts are not limited thereto.

A gate insulating film 132, a first work function adjusting layer 292 and a first gate electrode 251 that intersects the first and second active fins F1, F2 can be disposed on the first and second active fins F1, F2.

As illustrated in FIG. 5, the gate insulating film 132 can be formed on the upper surfaces of the first and second active fin F1, F2 and can be formed to have a shape that protrudes from the substrate 100 along the side walls of the spacers 115. Such a shape of the gate insulating film 132 can be due to the fact that the first pull-down transistor PD1 according to this embodiment is formed, for example, through a gate replacement process.

The gate insulating film 132 can also be formed along the upper surface of the element isolation film 103 and the upper surfaces and the side surfaces of the first and second active fins F1, F2.

The gate insulating film 132 can contain a high dielectric constant material having a dielectric constant higher than a silicon oxide film. For example, the gate insulating film 132 can contain $HfO_2$, $ZrO_2$, $AP_2O_3$ or $Ta_2O_5$, but embodiments of the inventive concepts are not limited thereto.

The first work function adjusting layer 292 can be formed on the gate insulating film 132. The first work function adjusting layer 292 can adjust the work function of the first pull-down transistor PD1, and the first gate electrode 251 can transmit the gate voltage applied from the outside. Also, the first gate electrode 251 can fill the space formed by the first work function adjusting layer 292.

In some embodiments, the first work function adjusting layer 292 can contain a first metal, and the first gate electrode 251 can contain a second metal.

As illustrated in FIG. 5, the first work function adjusting layer 292 can extend upward along the upper surface of the gate insulating film 132 and the side surfaces of the first gate electrode 251. The first work function adjusting layer 292 may have this shape since the first pull-down transistor PD1 according to this embodiment is formed, for example, through the gate replacement process.

Further, as illustrated in FIG. 5, the first work function adjusting layer 292 can be conformally disposed along the upper portion of the element isolation film 103, and the side walls and the upper portions of the first and second active fins F1, F2.

The first work function adjusting layer 292 may, for example, include an N-type work function adjusting layer. The first work function adjusting layer 292 may, for example, contain at least one of TiN, TaN, TiC, TiAlC and TaC.

The first gate electrode 251, for example, can contain W or Al. However, embodiments of the present invention are not limited thereto, and the configurations of the first work function adjusting layer 292 and the first gate electrode 251 may be modified from the configuration described above.

Meanwhile, in some other embodiments, the first gate electrode 251 can contain, for example, Si, SiGe, and the like rather than a metal.

The spacer 115 can be formed on at least one side of the first gate electrode 251. In some embodiments of the present inventive concept, the spacer 115 can be formed on both sides of the first gate electrode 251.

Although a columnar spacer 115 is illustrated in the drawings, the present disclosure is not limited thereto. In other embodiments, the spacer 115 may have a different shape.

In this embodiment, the spacer 115 may, for example, include a nitride film. Specifically, the spacer 115 can include a silicon nitride film. However, embodiments of the inventive concepts are not limited thereto, and other materials may be used to form the spacer 115. For example, in some other embodiments, the spacer 115 can include an oxide film or an oxynitride film.

First impurity epitaxial layers 130 can be formed on the first and second active fins F1, F2 on both sides of the spacer 115.

In some embodiments, the first impurity epitaxial layers 130 can be formed in a region in which the first and second active fins F1, F2 are partially etched. The first impurity epitaxial layer 130 can be formed on the first and second active fins F1, F2, for example, through an epitaxial growth process.

In some embodiments, the first impurity epitaxial layer 130 can be an elevated source or drain region. That is, the upper surface of the first impurity epitaxial layer 130 can be higher than the upper surfaces of the first and second active fins F1, F2.

The first impurity epitaxial layer 130 can contain a semiconductor material. In some embodiments, the first impurity epitaxial layer 130 may, for example, contain Si, but embodiments of the inventive concepts are not limited thereto.

In some embodiments, the first impurity epitaxial layer 130 can contain the same material as the substrate 100 or a tensile stress material. For example, when the substrate 100 contains Si, the first impurity epitaxial layer 130 can contain Si or can contain a material (e.g., SiC, SiP) having a lattice constant smaller than Si.

The tensile stress materials can improve mobility of a carrier of a channel region, by applying the tensile stress to the channel region defined in the first and second active fins F1, F2.

Referring to FIGS. 4 and 6, the first pull-up transistor PU1 can be defined in a region where the first gate electrode 251 intersects the third active fin F3.

The first pull-up transistor PU1 can include the third active fin F3, the first gate electrode 251, the second work function adjusting layer 294, the gate insulating film 132, the spacer 115 and the second impurity epitaxial layer 140.

Since the explanations of the third active fin F3, the first gate electrode 251, the gate insulating film 132 and the spacer 115 are substantially identical to those described above, the description thereof will not be repeated.

The second work function adjusting layer 294 can adjust the work function of the first pull-up transistor PU1. In some embodiments, the second work function adjusting layer 294 can include a third metal that is different from the first metal included in the first work function adjusting layer 292.

The second work function adjusting layer 294 may, for example, include a P-type work function adjusting layer. The second work function adjusting layer 294 may, for example, contain at least one of TiN, TaN, TiC, TiAlC and TaC.

The second impurity epitaxial layer 140 can contain a compressive stress material. For example, the compressive stress material can be a material having a lattice constant greater than Si such as, for example, SiGe.

The compressive stress material can improve the mobility of carriers in the channel region by applying the compressive stress to the channel region defined in the third active fin F3.

Since an interval P1 between the first active fin F1 and the second active fin F2 is narrow, the upper surface of the substrate 100 between the fins can be relatively high. Since an interval P2 between the third active fin F3 and the fourth active fin F4 is wide, the upper surface of the substrate 100 between the fins can be relatively low.

Thus, in this embodiment, the channel regions implemented for NFET transistors in the first and second active fins F1, F2 may be smaller than the channel regions implemented for PFET transistors in the third and fourth active fins F3, F4.

Since electrons are used as carriers in the NFET transistors and holes are used as carriers in the PFET transistors, when the channel regions of the NFET and PFET transistors are the same, the operational characteristics of the NFET and the PFET may change due to a difference in mobility of the carrier.

Referring to FIG. 4 again, the second pull-up transistor PU2 may be defined in a region in which the third gate electrode 253 intersects the fourth active fin F4. The second pull-down transistor PD2 may be defined in a region in which the third gate electrode 253 intersects the fifth and sixth active fins F5, F6.

Since the second pull-up transistor PU2 can have substantially the same configuration as the above-discussed first pull-up transistor PU1, and the second pull-down transistor PD2 can have substantially the same configuration as the above-discussed first pull-down transistor PD1, further description of the second pull-up transistor PU2 and the second pull-down transistor PD2 will be omitted.

As illustrated in FIG. 4, the semiconductor device 1 can include a first region in which the first and second pull-down transistors PD1, PD2 are defined which may, for example, be implemented as NFET transistors, and a second region in which the first and second pull-up transistors PU1, PU2 are defined which may, for example, be implemented as PFET transistors. An interval P1 between the active fins (e.g., F1, F2, F5, F6) that are disposed in the first region can be smaller than an interval P2 between the active fins (e.g., F3, F4) that are disposed in the second region. Thus, the active fins (e.g., F1, F2, F5, F6) that are disposed in the first region protrude from the element isolation film (e.g., 103) by a relatively small amount, and the active fins (e.g., F3, F4) disposed in the second region protrude from the element isolation film (e.g., 103) by a relatively large amount.

A first pass transistor PS1 may be defined in a region in which the second gate electrode 252 intersects the first and second active fins F1, F2. The second pass transistor PS2 may be defined in a region in which the fourth gate electrode 254 intersects the fifth and sixth active fins F5, F6.

Although it is not clearly illustrated, a large number of contacts 250 can be formed on both sides of a region in which the first to fourth gate electrodes 251 to 254 intersect the first to sixth active fins F1, F2, F3, F4, F5, F6.

A first shared contact 261 may electrically connect the third active fin F3, a third gate line 253, and a wire 271. A second shared contact 262 may electrically connect the fourth active fin F4, a first gate line 251 and a wire 272.

Figure 7:
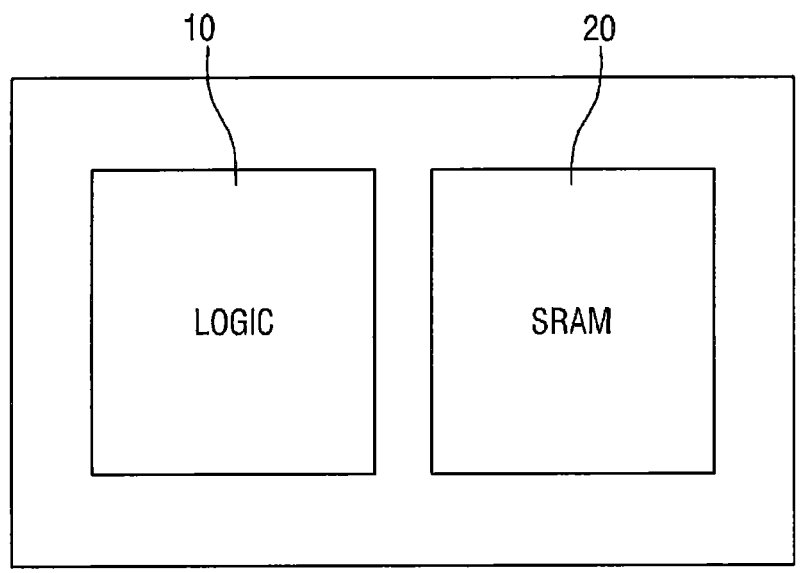
FIG. 7 is a conceptual diagram of a semiconductor device according to another embodiment of the inventive concepts.

FIG. 7 is a conceptual diagram of a semiconductor device according to another embodiment of the inventive concepts. The following discussion will describe differences from the above-described embodiments.

Referring to FIG. 7, a semiconductor device 4 according to this embodiment can include a logic region 10 and a SRAM forming region 20. Logic elements required for operating the semiconductor device 4 can be formed in the logic region 10, and a SRAM element can be formed in the SRAM forming region 20.

In some embodiments, any one of the semiconductor devices according to the above-described embodiments of the inventive concepts can be disposed in the SRAM forming region 20. In other embodiments of the inventive concepts, more than one of the different semiconductor devices according to the above-described embodiments of the inventive concepts can be disposed in combination with each other in the SRAM forming region 20.

Although FIG. 7 illustrates the logic region 10 and the SRAM forming region 20 as an example, it is not limited thereto. For example, semiconductor devices according to embodiments of the inventive concepts may be implemented in regions (e.g., DRAM, MRAM, RRAM, PRAM, and the like) in which a memory different from the logic region 10 is formed.

Figure 8:
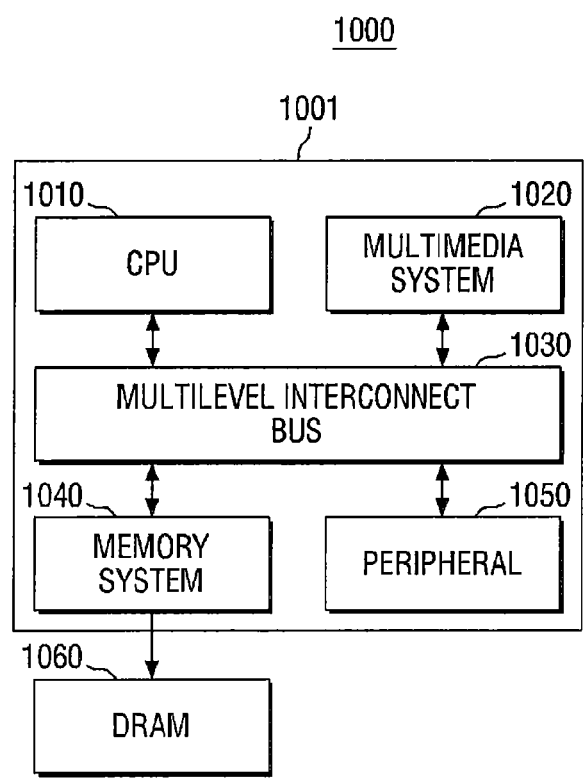
FIG. 8 is a block diagram of a SoC system that includes a semiconductor device according to the embodiments of the inventive concepts.

FIG. 8 is a block diagram of a SoC system that includes semiconductor devices according to the embodiments of the inventive concepts.

Referring to FIG. 8, the SoC system 1000 includes an application processor 1001 and a DRAM 1060.

The application processor 1001 can include a central processing unit 1010, a multimedia system 1020, a multilevel interconnection bus 1030, a memory system 1040, and a peripheral circuit 1050.

The central processing unit 1010 can perform the operations required for driving the SoC system 1000. In some embodiments of the inventive concepts, the central processing unit 1010 can be a multi-core environment that includes multiple cores.

In an embodiment, the central processing unit 1010 may, for example, include a SRAM cache memory. The cache memory can include a L1 cache memory and a L2 cache memory. The semiconductor device according to the above-described embodiments of the inventive concepts, for example, can be employed as a component of the cache memory.

The multimedia system 1020 can be used to perform a variety of multimedia functions in the SoC system 1000. The multimedia system 1020 can include a 3D engine module, a video codec, a display system, a camera system, a post-processor and the like.

The multilevel interconnection bus 1030 can be used for communications between the central processing unit 1010, the multi-media system 1020, the memory system 1040, and the peripheral circuit 1050. In some embodiments of the inventive concepts, the multilevel interconnection bus 1030 can have a multi-layer structure. Specifically, as examples of the multilevel interconnection bus 1030, a multi-layer AHB (multi-layer Advanced High-performance Bus) or a multi-layer AXI (multi-layer Advanced eXtensible Interface) can be used, but embodiments of the inventive concepts are not limited thereto.

The memory system 1040 can provide a necessary environment in which the application processor 1001 is connected to an external memory (e.g., DRAM 1060) to perform the high-speed operation. In some embodiments of the inventive concepts, the memory system 1040 may include another controller (e.g., a DRAM controller) for controlling the external memory (e.g., DRAM 1060).

The peripheral circuit 1050 can be used to smoothly connect the SoC system 1000 to an external device (e.g., a main board). The peripheral circuit 1050 can include various interfaces to connect the external device to the SoC system 1000.

The DRAM 1060 can function as an operation memory for the application processor 1001. In some embodiments of the inventive concepts, as illustrated, the DRAM 1060 can be external to the application processor 1001. For example, the DRAM 1060 can be packaged in the form of PoP (Package on Package) together with the application processor 1001.

At least one of the components of the SoC system 1000 can include at least one of the semiconductor devices according to the above-described embodiments of the inventive concepts.

Figure 9:
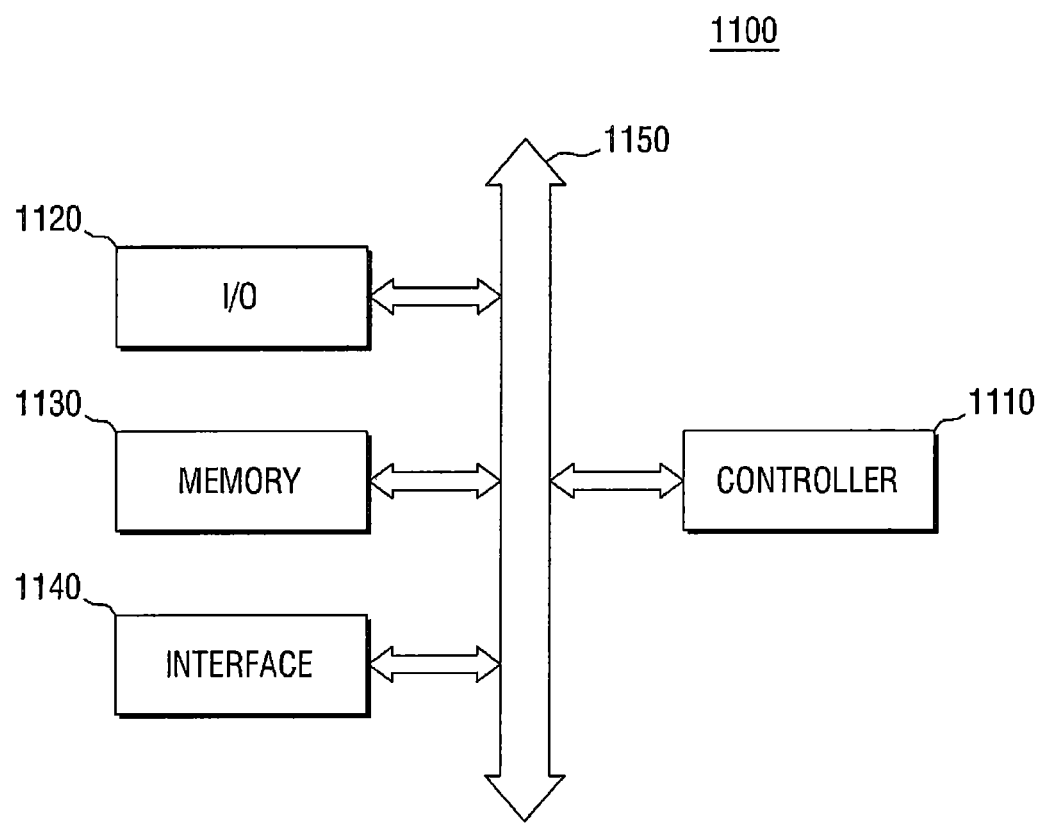
FIG. 9 is a block diagram of an electronic system that includes a semiconductor device according to embodiments of the inventive concepts.

FIG. 9 is a block diagram of an electronic system that includes the semiconductor device according to the embodiments of the inventive concepts.

Referring to FIG. 9, the electronic system 1100 according to an embodiment of the inventive concepts can include a controller 1110, an input/output device (I/O) 1120, a memory device 1130, an interface 1140 and a bus 1150. The controller 1110, the input/output device 1120, the memory device 1130 and/or the interface 1140 can be coupled together via the bus 1150. The bus 1150 corresponds to a path through which the data is moved.

The controller 1110 can include at least one of a microprocessor, a digital signal processor, a microcontroller, and/or logic elements capable of performing functions similar to such devices. The input/output device 1120 can include a keypad, a keyboard, a display device and the like. The memory device 1130 can store data and/or instructions. The interface 1140 can transfer data to the communication network and/or receive data from the communication network. The interface 1140 can be a wired or wireless interface. For example, the interface 1140 can include an antenna or a wired and wireless transceiver.

Although not illustrated, the electronic system 1100 can further include high-speed DRAM and/or SDRAM as an operation memory for improving the operation of the controller 1110. For example, when the electronic system 1100 includes a high-speed SRAM, the semiconductor device according to embodiments of the inventive concepts can be adopted in such a high-speed SRAM.

The semiconductor device according to the above-mentioned embodiments of the inventive concepts can be provided inside the memory device 1130 or can be provided as a part of the controller 1110, the input/output device (I/O) 1120 or the like.

The electronic system 1100 can be applied to a personal digital assistant (PDA), a portable computer, a web tablet, a wireless phone, a mobile phone, a digital music player, a memory card or any other electronic products that can transmit and/or receive information in a wireless environment.

Figure 10:
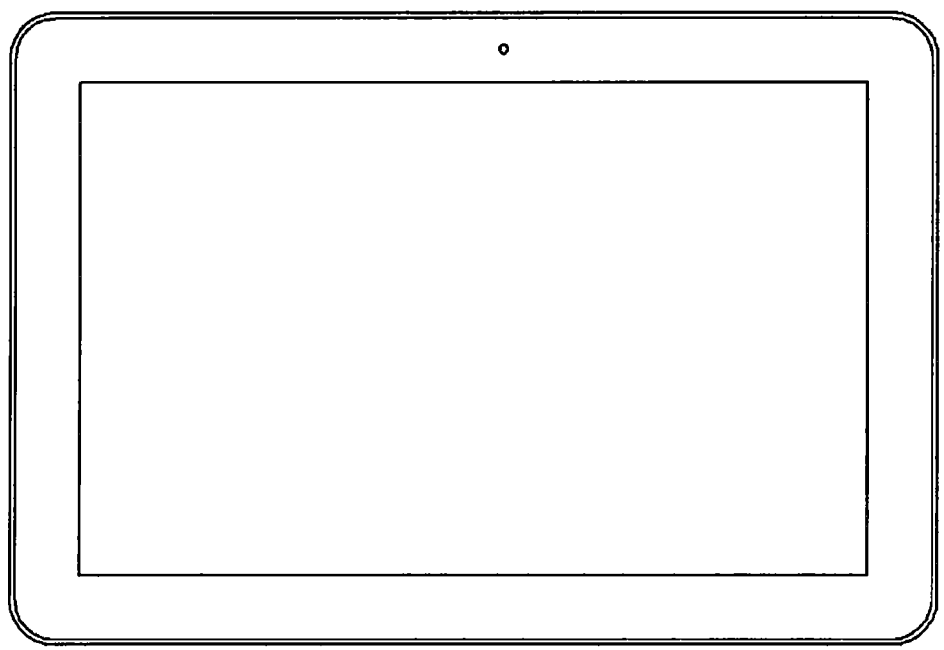
FIGS. 10 to 12 are exemplary semiconductor systems to which the semiconductor devices according to embodiments of the inventive concepts are applicable.
Figure 11:
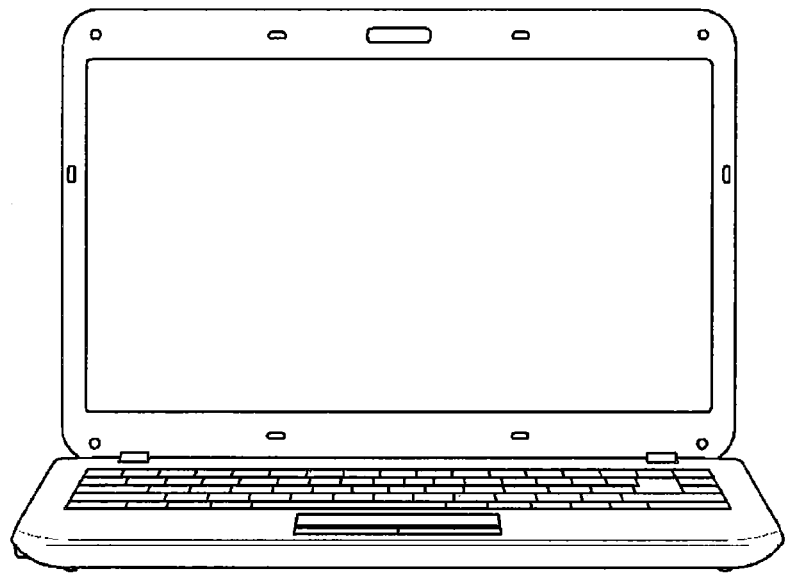
Figure 12:
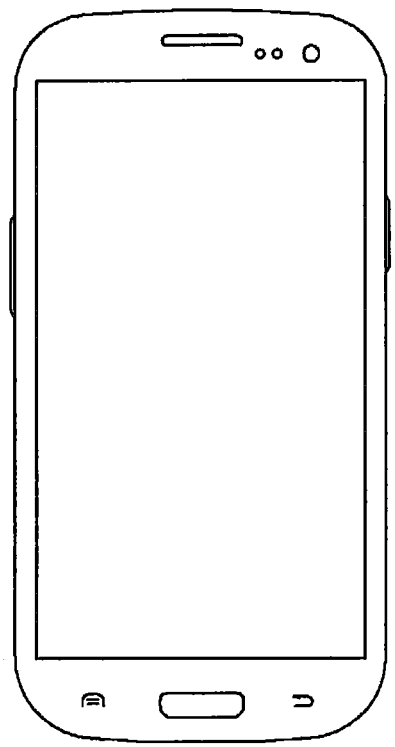

FIGS. 10 to 12 are exemplary semiconductor systems to which the semiconductor devices according to embodiments of the inventive concept may be applied.

FIG. 10 is a diagram illustrating a tablet PC 1200, FIG. 11 is a diagram illustrating a laptop computer 1300, and FIG. 12 is a diagram illustrating a smart phone 1400. A semiconductor device fabricated through the method of fabricating the semiconductor device according to the above-described embodiments of the inventive concepts can be used in the tablet PC 1200, the laptop computer 1300, the smart phone 1400 or the like.

Further, it will be apparent to those skilled in the art that the semiconductor devices according to the above-described embodiments of the inventive concepts are also applicable to other integrated circuit devices that are not illustrated.

That is, although only the tablet PC 1200, the laptop computer 1300 and the smart phone 1400 are described above as examples of the semiconductor system according to this embodiment, the semiconductor systems according to embodiments of the inventive concepts are not limited thereto.

In some embodiments of the inventive concepts, the semiconductor system may be achieved by a computer, an ultra mobile PC (UMPC), a workstation, a net-book, personal digital assistants (PDA), a portable computer, a wireless phone, a mobile phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player or the like.

FIGS. 4 and 13 to 26 are cross-sectional diagrams illustrating a method of fabricating a semiconductor device according to an embodiment of the inventive concepts.

Figure 13:
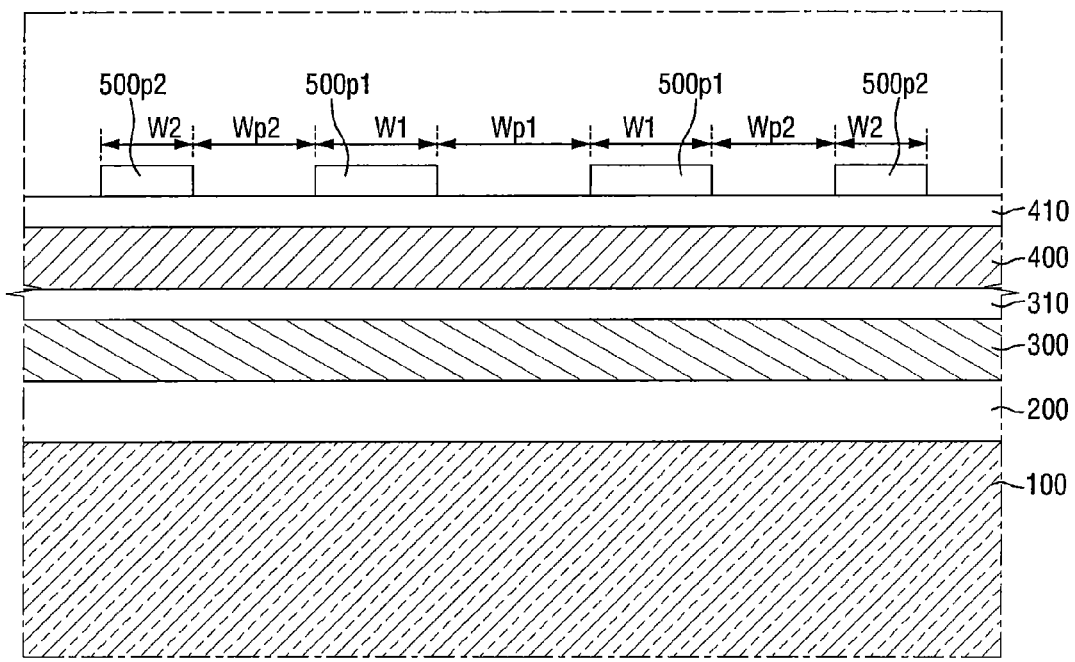
FIGS. 13 to 25 are cross-sectional diagrams that illustrate a method of fabricating a semiconductor device according to an embodiment of the inventive concepts.

Referring to FIG. 13, a hard mask layer 200, a first sacrificial layer 300, a first anti-reflective layer 310, a second sacrificial layer 400 and a second anti-reflective layer 410 are sequentially formed on the substrate 100.

The substrate 100 may be a semiconductor substrate such as a silicon wafer. Further, the substrate 100 may be a SOI (Silicon On Insulator) substrate. Other substrates 100 may be used.

The hard mask layer 200 may comprise a plurality of layers. Each of the plurality of layers may comprise at least one of silicon-containing materials such as silicon oxide (SiOx), silicon oxynitride (SiON), silicon nitride (SixNy), TEOS (TetraEthylOthoSilicate) or polycrystalline silicon, carbon-containing materials such as ACL (amorphous carbon layer) or SOH (Spin-On Hardmask), or metal. Lower layers of the plurality of layers, for example, can comprise a silicon nitride layer, and the lower layers can further include a thin silicon oxide layer below the silicon nitride layer. An intermediate layer may comprise silicon oxide. The upper layer may comprise polycrystalline silicon. However, embodiments of the inventive concepts are not limited thereto.

Figure 15:
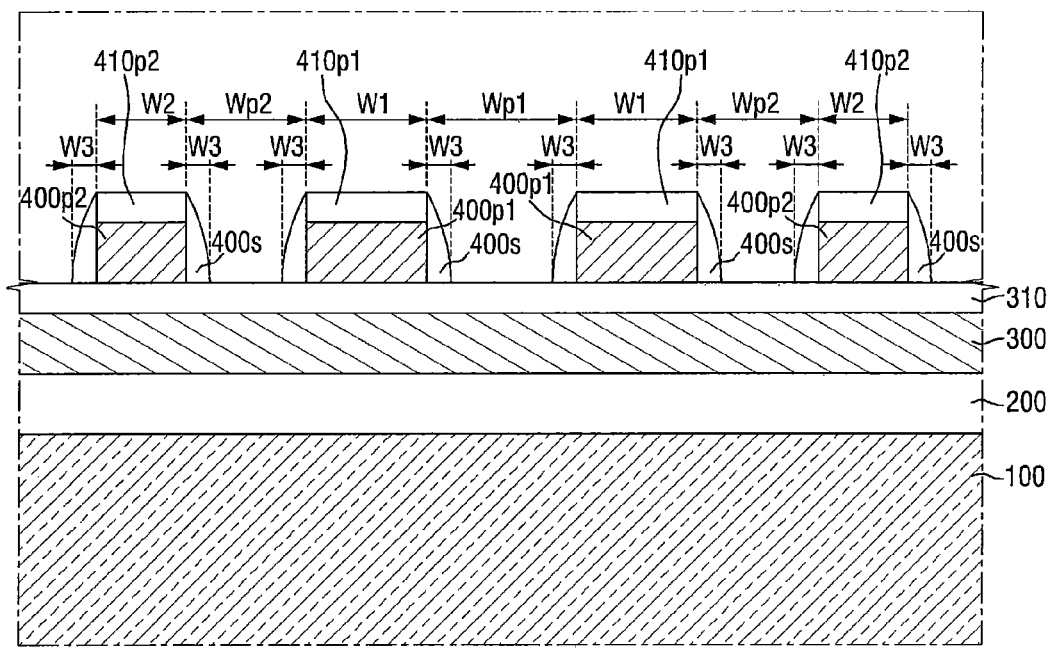
Figure 18:
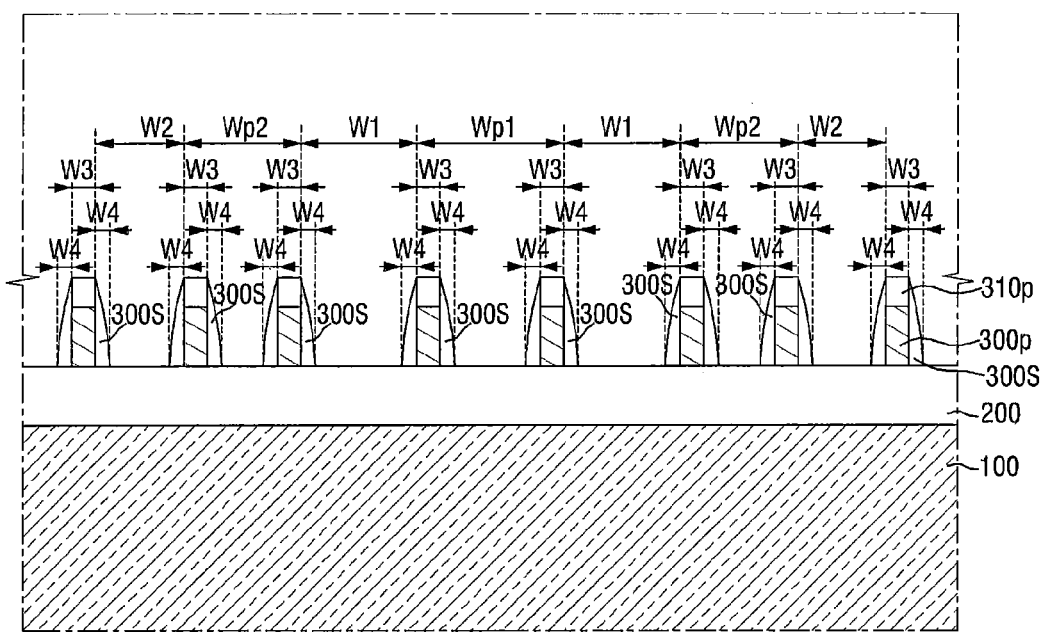

The first and second sacrificial layers 300, 400 are layers that are used to form first spacers 400s and second spacers 300s in subsequent processes (see FIGS. 15 and 18). The first and second sacrificial layers 300, 400 may contain any one of polycrystalline silicon, ACL (amorphous carbon layer) or SOH (Spin-On Hardmask).

First and second anti-reflective layers 310, 410 are layers that may be used to reduce or prevent reflection of light due to the lower film quality during the photolithography process. The first and second anti-reflective layers 310, 410 may comprise silicon oxynitride films (SiON).

The hard mask layer 200, the first and second sacrificial layers 300, 400, and the first and second anti-reflective layers 310, 410 can be formed by processes such as an atomic layer deposition (ALD) process, a chemical vapor deposition (CVD) process or spin coating, and a bake process and a curing process may be added depending on the materials.

Next, a photoresist PR is formed to cover the second sacrificial layer 400, and it is possible to form the first and second photoresist patterns 500p1, 500p2 in the form of lines through the photolithography process. Each of a plurality of first and second photoresist patterns 500p1, 500p2 may be formed. The first photoresist patterns 500p1 can be formed between the second photoresist patterns 500p2. The first photoresist patterns 500p1 may be spaced apart from each other. The second photoresist patterns 500p2 may also be spaced apart from each other.

Each of the plurality of first photoresist patterns 500p1 may have a width W1. That is, it is possible to have the same width so that the intervals of the transistor constituting a cell region of the SRAM can be symmetrical to each other. An interval Wp1 between adjacent first photoresist patterns 500p1 can be greater than the width W1. However, embodiments of the inventive concepts are not limited thereto. The width W1 or the interval Wp1 between the first photoresist patterns 500p1 can be adjusted for placement of the active fins that will be formed later.

Each of the plurality of second photoresist patterns 500p2 may have a width W2. An interval Wp2 between a second photoresist pattern 500p2 and an adjacent first photoresist pattern 500p1 can be different from the interval Wp1 between adjacent ones of the first photoresist patterns 500p1. Specifically, the interval Wp1 between adjacent ones of the first photoresist patterns 500p1 can be greater than the interval Wp2 between a second photoresist pattern 500p2 and an adjacent first photoresist pattern 500p1. However, embodiments of the inventive concepts are not limited thereto.

Figure 14:
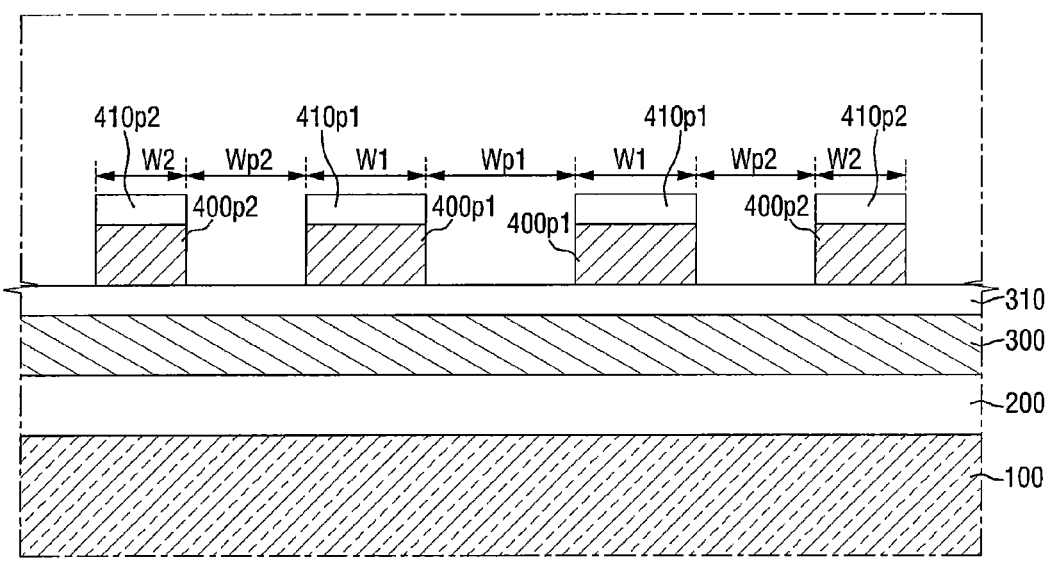

Referring to FIG. 14, by anisotropically etching the second anti-reflective layer 410 and the second sacrificial layer 400 using the first and second photoresist patterns 500p1, 500p2 as etching masks, an upper mandrel that includes a plurality of upper sub-mandrels 400p1, 400p2 in the form of lines can be formed on the first sacrificial layer 300. The upper sub-mandrels 400p1, 400p2 can include an upper cell sub-mandrel 400p1 and an upper dummy sub-mandrel 400p2.

The upper cell sub-mandrel 400p1 is formed by the first photoresist pattern 500p1, and the upper dummy sub-mandrel 400p2 is formed by the second photoresist pattern 500p2. Therefore, the width of the upper cell sub-mandrel 400p1 is the same as the width W1 of the first photoresist pattern 500p1, and the width of the upper dummy sub-mandrel 400p2 is the same as the width W2 of the second photoresist pattern 500p2. In addition, the interval between adjacent upper cell sub-mandrels 400p 1 is also the same as the interval Wp1 between the first photoresist patterns 500p1, and the interval between the upper cell sub-mandrel 400p1 and an adjacent upper dummy sub-mandrel 400p2 is the same as the interval Wp2 between the second photoresist pattern 500p2 and the first photoresist pattern 500p1. Therefore, the width W1 of the upper cell sub-mandrel 400p1 can be different from the width W2 of the upper dummy sub-mandrel 400p2. Specifically, the width W1 of the upper cell sub-mandrel 400p1 can be greater than the width W2 of the upper dummy sub-mandrel 400p2.

Referring to FIG. 15, first spacers 400s are formed on the side walls of the upper sub-mandrels 400p1, 400p2.

Specifically, a first spacer material layer may be formed that conformally covers the upper sub-mandrels 400p1, 400p2. The first spacers 400s can be formed on the side walls of the upper sub-mandrels 400p1, 400p2 by performing an etchback process. The width W3 of the first spacers 400s can be determined in consideration of an interval between fin type patterns. The interval between the fin type patterns can be narrower than a limit of resolution of a commercial photolithographic apparatus.

The first spacers 400s can be made of a material that has etching selectivity with respect to the upper sub-mandrels 400p1, 400p2. For example, when the upper sub-mandrels 400p1, 400p2 are made of any one of polycrystalline silicon, ACL (amorphous carbon layer) or SOH (Spin-On Hardmask), the first spacer material layer can be made of silicon oxide or silicon nitride. The first spacer material layer can be formed by an atomic layer deposition (ALD) process.

Figure 16:
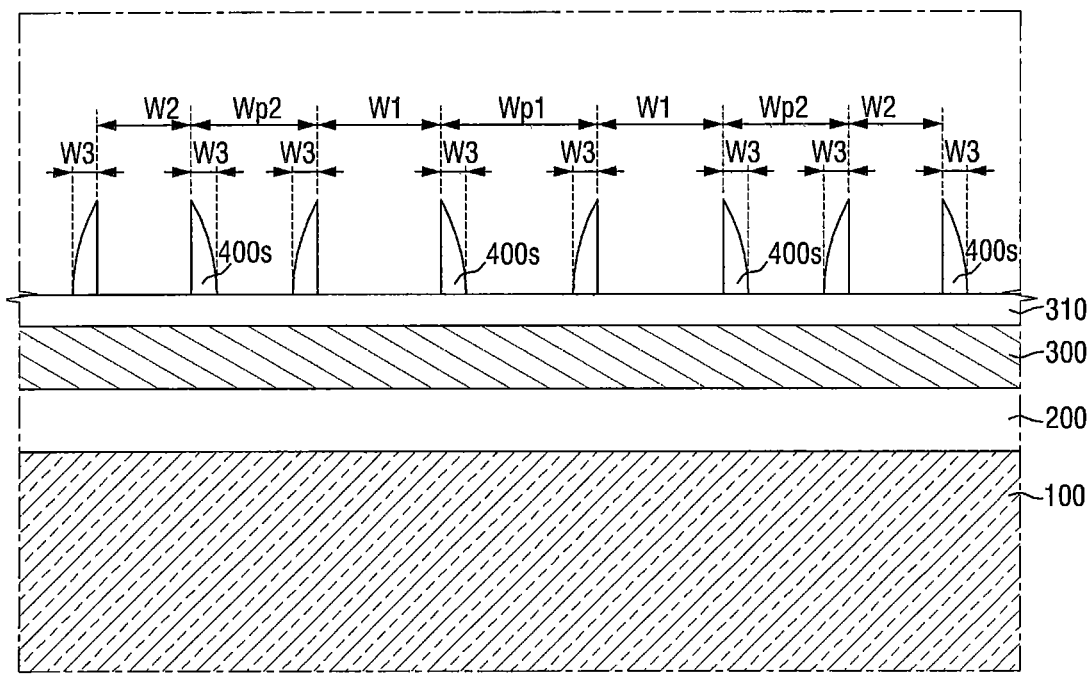

Referring to FIG. 16, the upper sub-mandrels 400p1, 400p2 may be selectively removed so that the first spacers 400s remain on the first sacrificial layer 300 in the form of lines. Since the first spacers 400s have etching selectivity with respect to the upper sub-mandrels 400p1, 400p2 under specific etching conditions, it is possible to selectively remove the upper sub-mandrels 400p1, 400p2.

Figure 17:
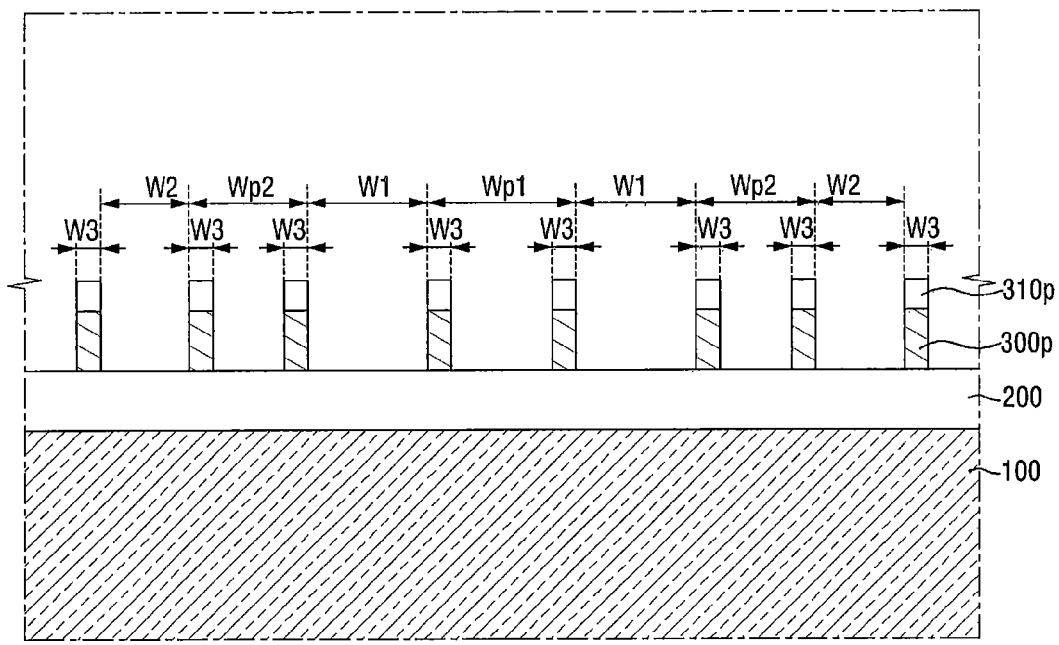

Referring to FIG. 17, a lower mandrel that includes a plurality of lower sub-mandrels 300p can be formed on the hard mask layer 200.

By etching the first anti-reflective layer 310 and the first sacrificial layer 300 using the first spacers 400s as etching masks, the lower sub-mandrels 300p can be formed on the hard mask layer 200. The width of each lower sub-mandrel 300P can be the same as the width W3 of the first spacers 400s. As illustrated, all of the lower sub-mandrels 300p may have the same width W3.

Referring to FIG. 18, second spacers 300s may be formed on the side walls of the lower sub-mandrels 300p.

Specifically, a second spacer material layer is formed that conformally covers the lower sub-mandrels 300p, and then an etchback process is performed to form the second spacers 300s on the side walls of the lower sub-mandrels 300p. The width W4 of each second spacer can be determined in consideration of the line width of the fin type patterns that are to be formed in a subsequent process. The line width of the fin type patterns can be smaller than the limit of resolution of the commercial photolithographic apparatus.

The second spacer material layer can be made of a material that has etching selectivity with respect to the lower sub-mandrels 300p. For example, when the lower sub-mandrels 300p are made of one of polycrystalline silicon, ACL (amorphous carbon layer) or SOH (Spin-On Hardmask), the second spacer material layer can be made of silicon oxide or silicon nitride. The second spacer material layer can be formed by an atomic layer deposition (ALD) process.

Figure 19:
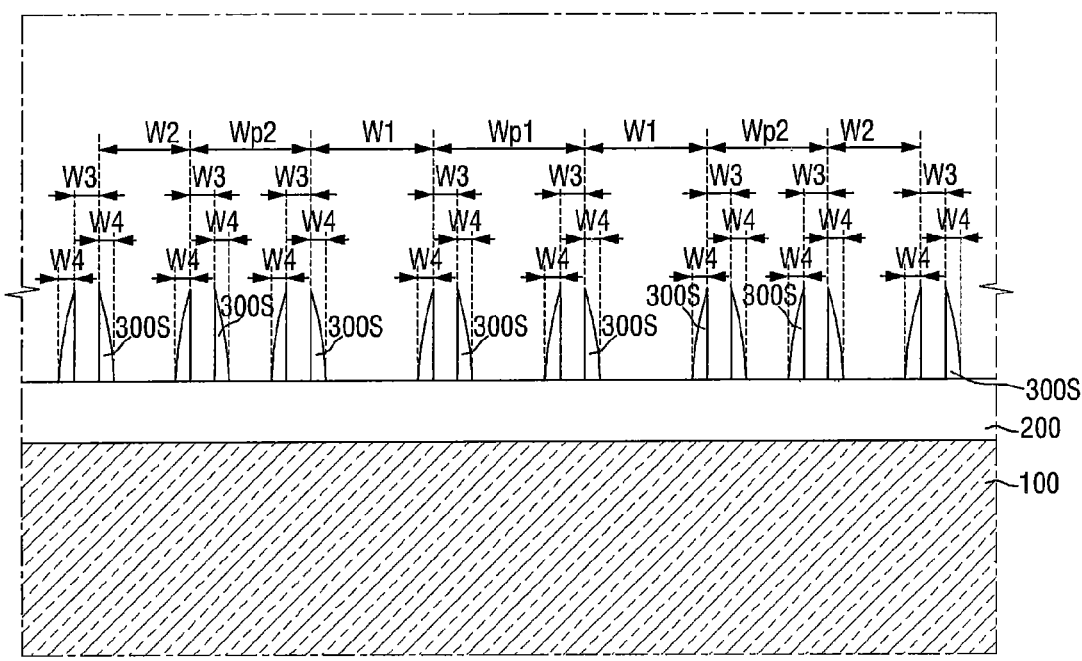

Referring to FIG. 19, the lower sub-mandrels 300p may be selectively removed to leave the second spacers 300s on the hard mask layer 200 in the form of a plurality of lines. Since the second spacers 300s have etching selectivity with respect to the lower sub-mandrels 300p under the specific etching conditions, it is possible to selectively remove the lower sub-mandrels 300p. The second spacers 300s can have different pitches.

Figure 20:
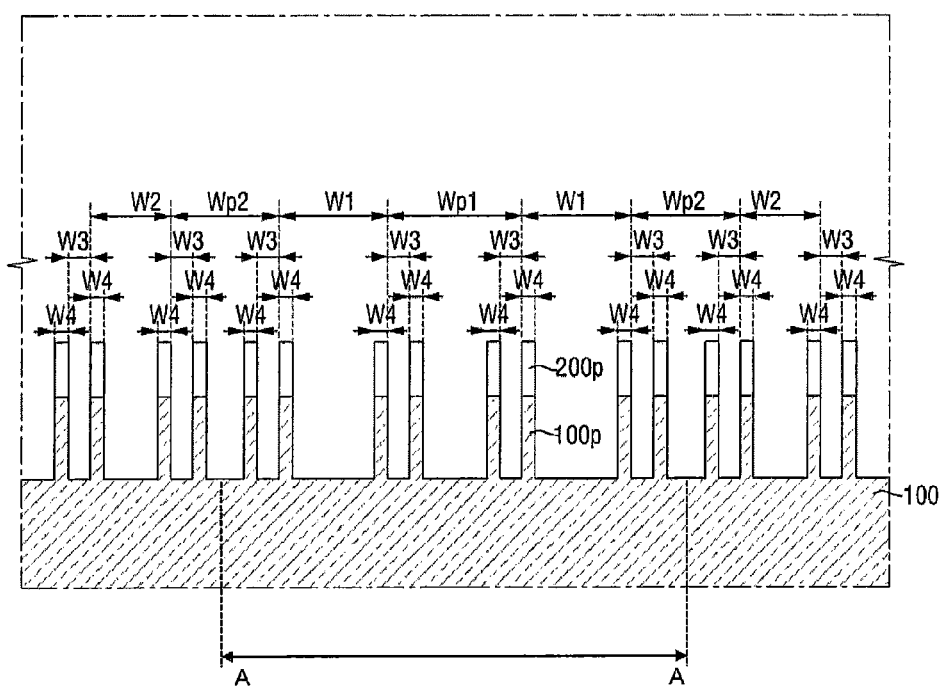

Referring to FIG. 20, by anisotropically etching the hard mask layer 200 and the substrate 100 using the second spacers 300s as etching masks, fin type patterns having different pitches may be formed on the substrate 100.

First, by etching the hard mask layers using the second spacers 300s having different pitches as etching masks, it is possible to form a hard mask pattern 200p having different pitches. Subsequently, by anisotropically etching the substrate 100 using the hard mask patterns 200p as etching masks, it is possible to form the fin type patterns 100p having different pitches. After the anisotropic etching of the substrate 100 is completed, the hard mask layer patterns 200p can remain on the upper parts of the fin type patterns 100p. The fin type patterns 100p can be disposed in pairs where the fin type patterns of each pair are separated by a distance or "interval". The interval W3 can be the same as the width of the second spacer 300s. The pairs of fin type patterns 100p can be separated by different intervals. The different intervals can be greater than the interval W3. Also, the different intervals may not be a multiple of the interval W3. For example, the interval W3 can be, but not limited to, 40 nm or less.

Figure 21:
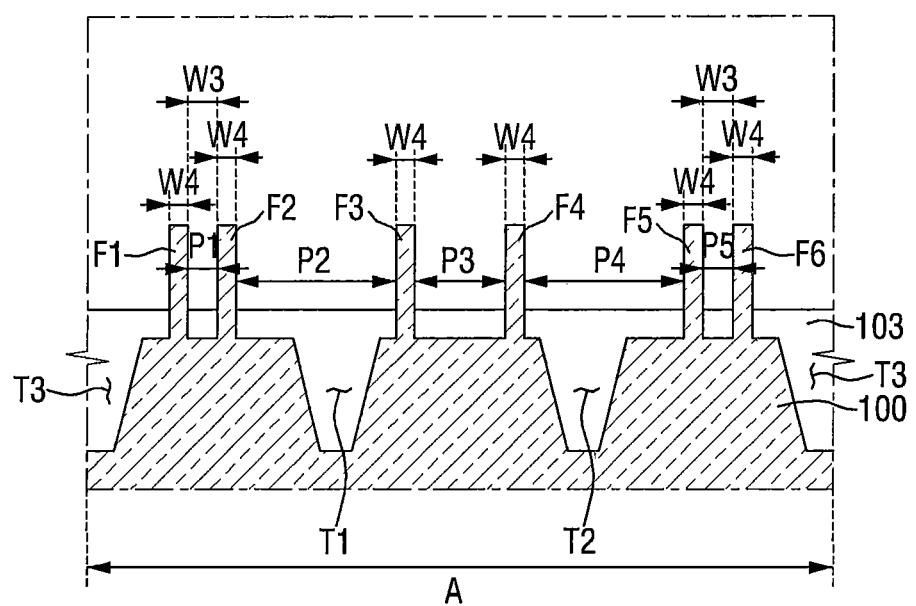

Referring to FIG. 21, by removing a part of the fin type pattern 100p, an element isolation film 103 can be formed so that the upper part of the fin type pattern 100p protrudes therefrom. FIG. 21 is an enlarged view of a part A-A of FIG. 20.

Eight fin type patterns 100p in the part A-A part of FIG. 20 can become a cell region of the SRAM. That is, the six fin type patterns 100p of the eight fin type patterns 100p can be the first to sixth fins F1 to F6. The fin type pattern 100p disposed between the second fin F2 and the third fin F3, and the fin type pattern 100p disposed between the fourth fin F4 and the fifth fin F5 can be removed. A portion in which the pattern is removed can be a portion that forms the intervals of P2 and P4 of FIG. 4. That is, the interval between the pull-down transistor and the pull-up transistor can be formed by the removal of the fin type pattern 100p.

Trenches T1, T2 can be formed at the locations where the fin type patterns 100p were removed during the removal of the two fin type patterns 100p. The trenches T1, T2 can be formed simultaneously with trenches T3 for the element isolation film. However, embodiments of the inventive concepts are not limited thereto. The trenches T1 to T3 can be formed on the upper surface of the substrate 100 to have a step. The trenches T1 to T3 can have side walls that are discontinuous with the side surfaces of the fin type pattern 100p.

After forming an insulating layer that fills in shallow trenches that are formed between the fin type patterns 100p by anisotropically etching the substrate 100, a preliminary element isolation layer may be formed by performing a flattening process so that the hard mask pattern 200p appears.

Next, after forming deep trenches T1 to T3, an insulating layer is formed that fills up the deep trenches. Next, the element isolation film 103 is formed by performing the flattening process so that the hard mask pattern 200p is exposed. However, embodiments of the inventive concepts are not limited thereto, and the deep trenches T1 to T3 may not be formed depending on the embodiments.

The insulating layer can be made of at least one of boron-phosphor silicate glass (BPSG), high density plasma (HDP), flowable oxide (FOX), tonen silazene (TOSZ), spin on glass (SOG), undoped silica glass (USG), tetraethyl ortho silicate (TEOS), and low temperature oxide (LTO). The flattening process can be a chemical mechanical polishing (CMP) process.

Next, after removing the hard mask pattern 200p that remains on the upper parts of the fin type patterns 100p, the element isolation film 103 can be etched to a predetermined depth so that the upper parts of the fin type patterns 100p protrude above the top surface of the element isolation film 103.

The intervals P1 to P5 of the first to sixth fins F1 to F6 can be diverse. The interval P1 between the first and second fins F1, F2 can be the same as the interval P5 between the fifth and sixth fins F5, F6. This is a result of the fact that the second spacers 300s each have the same width W4. The interval P2 between the second and third fins F2, F3 and the interval P4 between the fourth and fifth fins F4, F5 can be adjusted depending on the widths of the upper sub-mandrels 400p1, 400p2. That is, as the widths of the upper sub-mandrels 400p1, 400p2 are equally formed, the interval P2 between the second and third fins F2, F3 and the interval P4 between the fourth and fifth fins F4, F5 can be identical to each other.

The interval P3 between the third and fourth fins F3, F4 can be determined depending on the interval Wp1 between the upper sub-mandrels 400p1, 400p2. Referring to FIG. 4, the pull-up transistors can be formed in each of the third fin F3 and the fourth fin F4. In the semiconductor device according to an embodiment of the inventive concepts, as the interval between the upper sub-mandrels 400p1, 400p2 is adjusted, a fin cut, i.e., etching of the fin type pattern may not be required between the third fin F3 and the fourth fin F4. That is, by simply widening the interval between the upper sub-mandrels 400p1, 400p2, it is possible to adjust the interval between the third fin F3 and the fourth fin F4. Thus, the trench may not be formed between the third fin F3 and the fourth fin F4.

Figure 22:
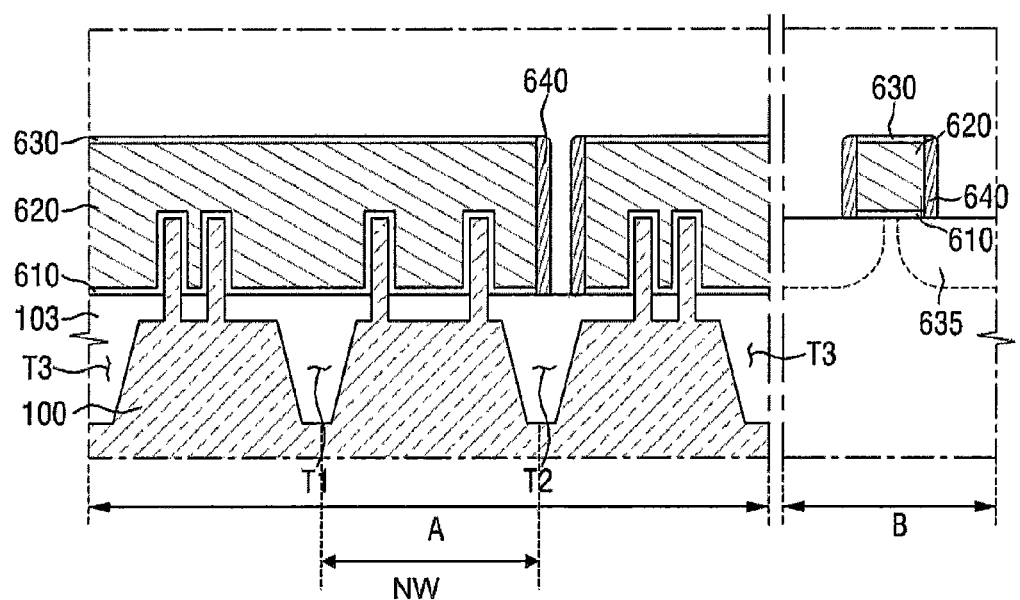

FIGS. 22 to 25 illustrate a device formed through the processes described with reference to FIGS. 13 to 21. FIGS. 22 to 25 are cross-sectional views taken along a line A-A and a line B-B of FIG. 4. Referring to FIG. 22, the substrate 100 can include an N-well region NW. Regions other than the N-well region NW can be regions that are doped with P-type impurities. The N-well region NW can be formed on the substrate 100 in advance before forming the fin type patterns 100p.

A sacrificial gate insulating layer 610 and a sacrificial gate electrode 620 may be formed that cover the first to sixth fins F1 to F6 that are exposed through the element isolation film 103.

First, the sacrificial gate insulating layer 610, the sacrificial gate electrode 620 and the mask layer 630 are formed. Subsequently, after patterning the mask layer 630, the sacrificial gate electrode 620 can be patterned using the patterned mask layer as an etching mask.

The sacrificial gate insulating layer 610 can include, for example, at least one of a silicon oxide film or a silicon oxynitride film. The sacrificial gate electrode layer 620 can be made of polycrystalline silicon, but is not limited thereto.

Next, a gate spacer 640 can be formed on the side surface of the sacrificial gate electrode 630, and a source/drain region 635 can be formed in the active pattern that is exposed to the side surface of the sacrificial gate electrode 630.

In particular, after conformally forming a spacer material layer on the sacrificial gate electrode 630, the gate spacer 640 can be formed by performing the etchback of the spacer material layer. Subsequently, the source/drain region 635 may be formed by performing the ion-implantation of the impurities. For the activation of impurities, a heat treatment process can be executed after the ion implantation.

Figure 23:
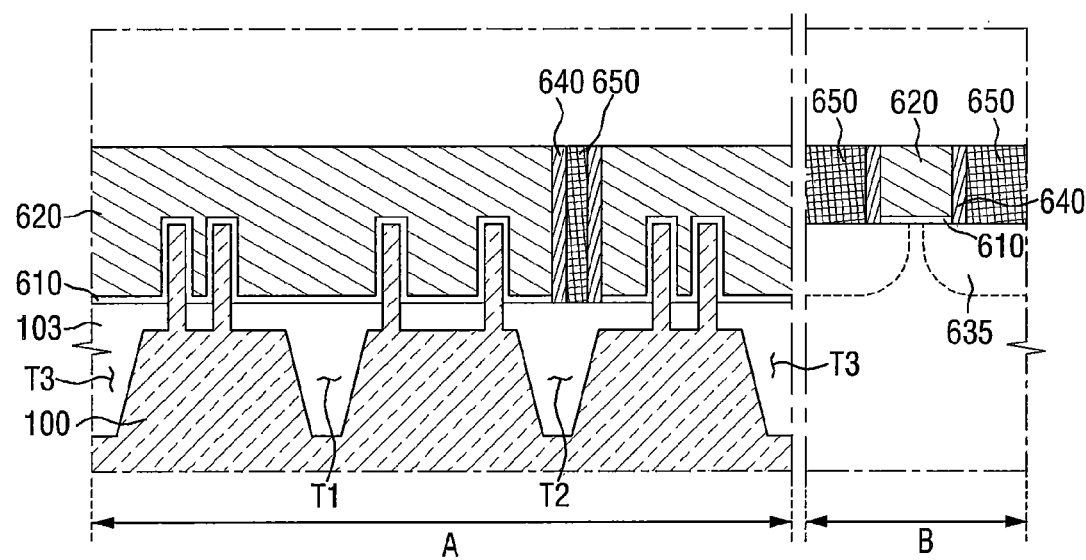

Referring to FIG. 23, an interlayer insulating layer 650 is formed that surrounds the sacrificial gate electrode 620 and the gate spacer 640 and exposes the upper surface of the sacrificial gate electrode 620.

After forming the interlayer insulating layer 650 that covers the sacrificial gate electrode 620 and the gate spacer 640, the flattening process may be performed so that the upper surface of the sacrificial gate electrode 620 is exposed. The flattening process may comprise, for example, a chemical mechanical polishing process. The interlayer insulating layer 650 can be completed through the flattening process.

Figure 24:
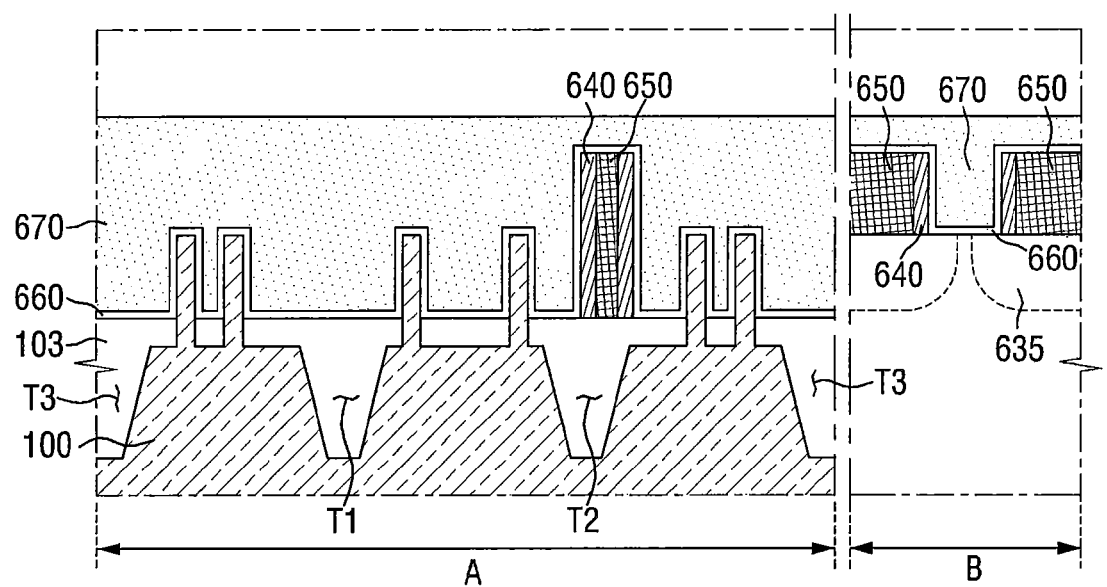
Figure 25:
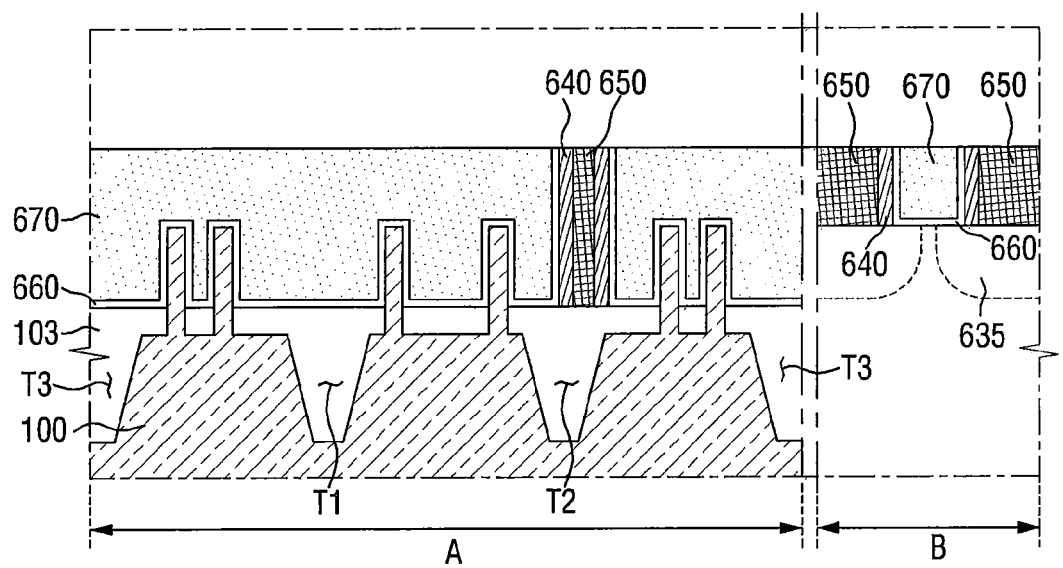

Referring to FIGS. 24 and 25, a trench is formed within the interlayer insulating layer 650 by removing the sacrificial gate electrode 620 and the sacrificial gate insulating layer 610. The gate insulating layer 660 and the gate electrode 670 can be conformally formed within the trench. Subsequently, a flattening process can be performed to expose the upper surface of the interlayer insulating layer 650. The gate electrode 670 can be completed through the flattening process.

The gate insulating layer 660 can include a high dielectric constant film. Herein, the term a "high dielectric constant film" refers to one or more insulating materials having a dielectric constant that is higher than the dielectric constant of a silicon oxide film. Examples of such high dielectric constant films include a tantalum oxide film, a titanium oxide film, a hafnium oxide film, a zirconium oxide film, an aluminum oxide film, a yttrium oxide film, a niobium oxide film, a hafnium silicate film and a zirconium silicate film. The gate insulating layer 660 can be formed by, for example, chemical vapor deposition (CVD) or atomic layer deposition (ALD).

The gate electrode 670 can include at least one work function adjusting film and at least one gate metal. The work function adjusting film can be any one that is selected from a group consisting of TiN, TaN, WN, TiAl, TiAlN, TaC or TiC. The gate metal can be at least one of aluminum (Al), tungsten (W) or molybdenum (Mo). The work function adjusting film may serve as a diffusion prevention film of the gate metal. The gate electrode 670 can be formed by, for example, chemical vapor deposition or atomic layer deposition depending on the material.

The work function adjusting film in the N-well region NW may be different from the work function adjusting layer in other regions (regions doped with the P-type impurities), and an additional process may be required to form the work function adjusting film in the regions doped with P-type impurities.

A method of fabricating the semiconductor device according to an embodiment of the inventive concepts can form a miniaturized SRAM cell using self aligned quadruple patterning (SAQP). A plurality of fin type patterns that are spaced apart from each other at specific intervals may be required to form the SRAM. A method of forming several fins of the same interval and removing intermediate fins to increase the interval between some fins has been used in the past. In such a method, elements in the SRAM can be spaced apart from each other only by a multiple of the fin pitch. That is, it is not possible to precisely space the fins at the required intervals, and instead it is only possible to space the respective fins by a multiple of the fin pitch.

In contrast, in the method of fabricating the semiconductor device according to embodiments of the inventive concepts, each different fin pitch that is desired can be achieved by adjusting the width and the interval of the sub-mandrels. Thus, it is possible to manufacture a semiconductor device having a desired optimal interval rather than a multiple of the existing given fin pitch. Furthermore, by adjusting the interval between the sub-mandrels, in the existing fin type pattern of the same pitch, it is possible to reduce waste of the process by securing the interval in advance without the necessity of removing the fin even in a portion (interval between the two pull-up transistor elements) required to remove the fin, and it is also possible to reduce the risk due to an additional process.

Furthermore, by introducing the SAQP method, a degree of difficulty of the single cutting process of a plurality of fin type patterns that are closely adjacent to one another may increase. That is, a yield of the process of removing one fin type pattern may decrease. Therefore, it is possible to independently remove the fin type pattern by setting the wide interval between each fin type pattern in advance. This makes it possible to improve the reliability of the semiconductor device.

A method of fabricating a semiconductor device according to another embodiment of the inventive concepts will be described below referring to FIG. 26. The repeated parts of the above-described embodiments will be omitted.

Figure 26:
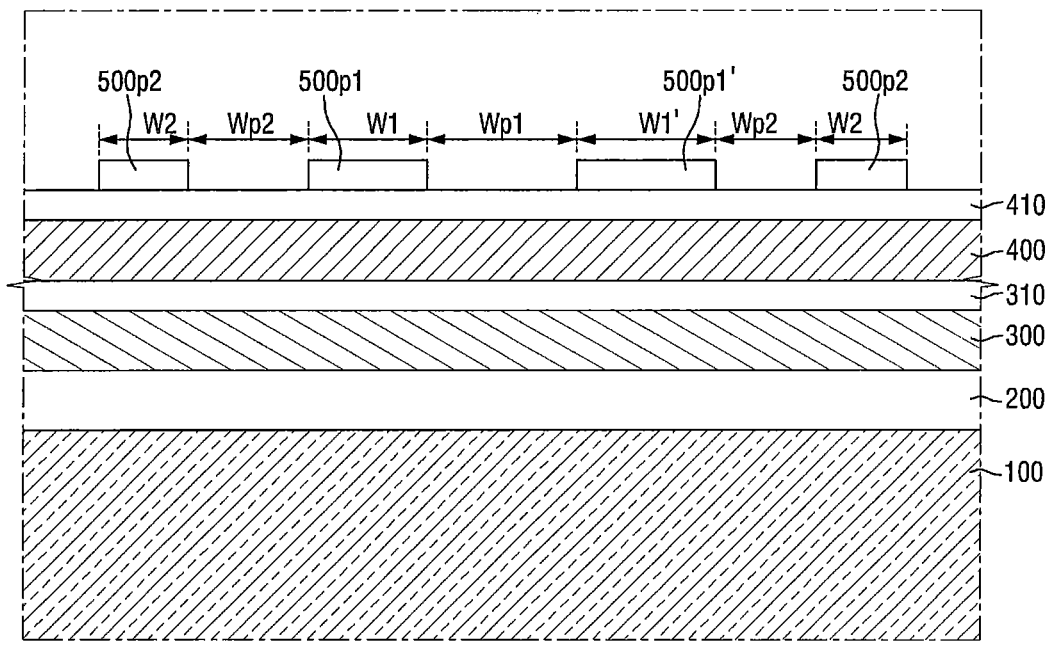
FIG. 26 is a cross-sectional diagram for explaining a method of fabricating a semiconductor device according to another embodiment of the inventive concepts.

Referring to FIG. 26, upper cell sub-mandrels 500p1, 500p1' can have different widths W1, W1'. Since the upper cell sub-mandrels 500p1, 500p1' have different widths, all the intervals of the first spacers 400s, the lower sub-mandrels 300p, the second spacer 300s and the fin type patterns 100p to be formed later can change. Thus, in the method of fabricating the semiconductor device of this embodiment, the arrangement of the pull-up and pull-down transistors can be performed in consideration of a minute error in the process.

While the inventive concepts have been particularly shown and described with reference to exemplary embodiments thereof, it will be understood by those of ordinary skill in the art that various changes in form and details may be made therein without departing from the spirit and scope of the inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A method of fabricating a semiconductor device, the method comprising:
   sequentially forming a hard mask layer and a first sacrificial layer on a substrate;
   forming an upper mandrel that includes at least first to third upper sub-mandrels on the first sacrificial layer, the first to third upper sub-mandrels each extending in a first direction and being spaced apart from each other in a second direction that intersects the first direction, a width of the first upper sub-mandrel in the second direction being smaller than widths of the second and third upper sub-mandrels in the second direction;
   forming first spacers on both side walls of each of the first through third upper sub-mandrels;
   removing the upper mandrel;
   etching the first sacrificial layer using the first spacers as etching masks to form a lower mandrel that includes a plurality of lower sub-mandrels;
   forming second spacers on both side walls of the lower sub-mandrels;
   removing the lower mandrel;
   patterning the hard mask layer and the substrate using the second spacers as etching masks to form a fin type pattern, the fin type pattern including first to tenth fins which extend alongside each other in the first direction and are spaced apart from each other in the second direction;
   removing the first, second, fifth and eighth fins; and
   forming a first gate electrode and a second gate electrode, the first gate electrode extending in the second direction to intersect the third, fourth, sixth and seventh fins, and the second gate electrode extending in the second direction to intersect the sixth, seventh, ninth and tenth fins while not intersecting the third and fourth fins, and being spaced apart from the first gate electrode in the first direction.

2. The method of claim 1, wherein forming the upper mandrel comprises:
   forming a second sacrificial layer on the first sacrificial layer; and
   forming the upper mandrel by etching the second sacrificial layer.

3. The method of claim 2, further comprising:
   forming an anti-reflective layer between the first and second sacrificial layers.

4. The method of claim 1, wherein a width of the second upper sub-mandrel is different than a width of the third upper sub-mandrel.

5. The method of claim 1, wherein an interval between the first and second upper sub-mandrels is smaller than an interval between the second and third upper sub-mandrels.

6. The method of claim 1, wherein the first spacer is formed by an atomic layer deposition process.

7. The method of claim 1, wherein the lower sub-mandrels all have the same width in the second direction.

8. The method of claim 1, further comprising:
   forming an element isolation film after removing the first, second, fifth and eighth fins, wherein the third, fourth, sixth, seventh, ninth and tenth fin type patterns protrude above an upper surface of the element isolation film.

9. The method of claim 8, wherein forming the element isolation film comprises:
   forming a trench by etching the first and second fins; and
   forming the element isolation film in the trench.

10. The method of claim 1, wherein removing the first, second, fifth and eighth fins comprises:
    forming a first trench by etching the first and second fins, forming a second trench by etching the fifth fin and forming a third trench by etching the eighth fin.

11. A method of fabricating a semiconductor device, the method comprising:
    sequentially forming a hard mask layer and a first sacrificial layer on a substrate;
    forming an upper mandrel that includes a plurality of upper sub-mandrels on the first sacrificial layer;
    forming first spacers on side walls of upper sub-mandrels;
    removing the upper mandrel;
    etching the first sacrificial layer using the first spacers as etching masks to form a lower mandrel that includes a plurality of lower sub-mandrels;
    forming second spacers on side walls of the lower sub-mandrels;
    removing the lower mandrel;
    forming first to sixth active fins which extend alongside one another in a first direction and are spaced apart from one another in a second direction that intersects the first direction by patterning the hard mask layer and the substrate using the second spacers as etching masks; and
    forming a first gate electrode and a second gate electrode, the first gate electrode extending in the second direction to intersect the first to fourth active fins, and the second gate electrode extending in the second direction to intersect the third through sixth active fins, the second gate electrode not intersecting the first and second active fins, and being spaced apart from the first gate electrode in the first direction.

12. The method of claim 11, wherein the plurality of upper sub-mandrels includes at least a first upper sub-mandrel and a second upper sub-mandrel, and
    widths of the first and second upper sub-mandrels are different from each other.

13. The method of claim 11, wherein an interval between the first and second active fins is less than 40 nm.

14. The method of claim 11, wherein a part of the third active fin overlaps a part of the fourth active fin in the second direction.

15. The method of claim 11, further comprising:
    forming trenches on both sides of the first to sixth active fins; and
    filling the trenches to form an element isolation film, wherein the first to sixth active fins protrude above an upper surface of the element isolation film.

16. A method of fabricating a semiconductor device, the method comprising:
    forming a hard mask layer on a substrate;
    forming a first sacrificial layer on the hard mask layer opposite the substrate;
    forming an upper mandrel that includes at least a first upper sub-mandrel and a second upper sub-mandrel on the first sacrificial layer, the first and second upper sub-mandrels each extending in a first direction and being spaced apart from each other in a second direction that intersects the first direction;
    forming first spacers on side walls of the first upper sub-mandrel and the second upper sub-mandrel;
    selectively removing the upper mandrel;

etching the first sacrificial layer using the first spacers as etching masks to form a lower mandrel that includes at least first to fourth lower sub-mandrels;

forming second spacers on side walls of the first through fourth lower sub-mandrels;

removing the lower mandrel;

patterning the hard mask layer and the substrate using the second spacers as etching masks to form a fin type pattern, the fin type pattern including first to eighth fins which extend alongside each other in the first direction and are spaced apart from each other in the second direction;

removing the third and sixth fins; and forming a first gate electrode and a second gate electrode, the first gate electrode extending in the second direction to intersect the first, second, fourth and fifth fins, and the second gate electrode extending in the second direction to intersect the fourth, fifth, seventh and eighth fins while not intersecting the first and second fins, and being spaced apart from the first gate electrode in the first direction.

17. The method of claim 16, wherein a first interval between the first and second fins is the same as a second interval between the seventh and eighth fins, and wherein a third interval between the second and fourth fins is different from the first interval and is not an integer multiple of the first interval.

18. The method of claim 16, wherein an interval between the first and second fins is less than 40 nm.

19. The method of claim 16, wherein the first and second fins intersect the first gate electrode to define a first transistor, wherein the fourth fin intersects the first gate electrode to define a second transistor, and wherein the fifth fin intersects the second gate electrode to define a third transistor.

20. The method of claim 16, wherein the conductivity type of the first transistor is different than the conductivity types of the second and third transistors.

21. A semiconductor device comprising:

first to sixth active fins that extend alongside one another in a first direction;

a first gate electrode that extends in a second direction that intersects the first direction, the first gate electrode intersecting the first to fourth active fins; and a second gate electrode that extends in the second direction to intersect the third through sixth active fins, the second gate electrode not intersecting the first and second active fins, the second gate electrode spaced apart from the first gate electrode in the first direction, wherein a first interval between the first and second active fins is the same as a second interval between the fifth and sixth active fins, and wherein a third interval between the second and third active fins is different from the first interval and is not an integer multiple of the first interval, wherein lengths of the first and second active fins are different from lengths of the third and fourth active fins.

* * * * *